US012641853B2

(12) United States Patent
Sampath et al.

(10) Patent No.: US 12,641,853 B2
(45) Date of Patent: May 26, 2026

(54) GATE TRENCH POWER SEMICONDUCTOR DEVICES HAVING IMPROVED BREAKDOWN PERFORMANCE AND METHODS OF FORMING SUCH DEVICES

(71) Applicant: Wolfspeed, Inc., Durham, NC (US)

(72) Inventors: Madankumar Sampath, Morrisville, NC (US); Woongsun Kim, Cary, NC (US); Naeem Islam, Morrisville, NC (US); Sei-Hyung Ryu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 493 days.

(21) Appl. No.: 17/847,650

(22) Filed: Jun. 23, 2022

(65) Prior Publication Data

US 2023/0420527 A1      Dec. 28, 2023

(51) Int. Cl.
| | |
|---|---|
| *H10D 64/00* | (2025.01) |
| *H10D 12/01* | (2025.01) |
| *H10D 30/66* | (2025.01) |
| *H10D 62/832* | (2025.01) |
| *H10D 64/01* | (2025.01) |

(52) U.S. Cl.
CPC ......... *H10D 64/118* (2025.01); *H10D 12/031* (2025.01); *H10D 30/668* (2025.01); *H10D 62/8325* (2025.01); *H10D 64/01* (2025.01)

(58) Field of Classification Search
CPC ............. H10D 12/038; H10D 30/0297; H10D 30/658; H10D 30/665; H10D 62/60; H10D 62/105; H10D 62/107; H10D 62/115; H10D 62/127; H10D 64/251; H10D 64/514; H10D 64/517; H10D 64/519

USPC ......................................................... 257/261
See application file for complete search history.

(56) References Cited

U.S. PATENT DOCUMENTS

| | | | | |
|---|---|---|---|---|
| 6,642,600 | B2 | 11/2003 | Narazaki et al. | |
| 8,008,715 | B2 | 8/2011 | Kawaguchi et al. | |
| 8,222,108 | B2 | 7/2012 | Hsieh | |
| 2004/0173844 | A1* | 9/2004 | Williams ............. | H10D 30/665 257/329 |
| 2007/0114601 | A1* | 5/2007 | Lin ...................... | H10D 64/517 257/E29.136 |
| 2008/0079081 | A1* | 4/2008 | Hashimoto .......... | H10D 30/668 257/E29.255 |
| 2009/0085105 | A1 | 4/2009 | Su et al. | |
| 2010/0123220 | A1 | 5/2010 | Burke et al. | |
| 2011/0089486 | A1 | 4/2011 | Xu et al. | |

(Continued)

FOREIGN PATENT DOCUMENTS

| | | |
|---|---|---|
| JP | 2003258254 A | 9/2003 |
| JP | 2020027858 A | 2/2020 |
| JP | 2022015781 A | 1/2022 |

OTHER PUBLICATIONS

"International Search Report and Written Opinion in Corresponding Application No. PCTUS23025238, mailed Nov. 23, 23, 20 pages".

*Primary Examiner* — Fazli Erdem
(74) *Attorney, Agent, or Firm* — Myers Bigel, P.A.

(57) ABSTRACT

A semiconductor device includes a semiconductor layer structure comprising a gate trench formed in an upper surface thereof, a gate finger in the gate trench, a supplemental dielectric layer on an upper surface of the gate finger and vertically overlaps the gate trench, and a gate connector on an upper surface of the supplemental dielectric layer and on an upper surface of the gate finger.

21 Claims, 24 Drawing Sheets

(56)　　　　　References Cited

U.S. PATENT DOCUMENTS

| | | | |
|---|---|---|---|
| 2011/0233659 A1 | 9/2011 | Tai | |
| 2011/0291183 A1 | 12/2011 | Lin et al. | |
| 2013/0313576 A1* | 11/2013 | Nakano | H01L 29/1095 |
| | | | 257/77 |
| 2014/0167145 A1 | 6/2014 | Ichinoseki | |
| 2016/0093731 A1* | 3/2016 | Meiser | H01L 21/26586 |
| | | | 438/286 |
| 2016/0284838 A1 | 9/2016 | Qin et al. | |
| 2017/0033189 A1* | 2/2017 | Werner | H01L 29/66696 |
| 2017/0194486 A1 | 7/2017 | Venkatraman et al. | |
| 2018/0350960 A1 | 12/2018 | Naito | |
| 2020/0161460 A1 | 5/2020 | Harada et al. | |
| 2021/0069926 A1 | 3/2021 | Fuji et al. | |
| 2021/0367071 A1 | 11/2021 | Shinoda et al. | |
| 2022/0013437 A1* | 1/2022 | Nishi | H01L 29/0696 |
| 2022/0149165 A1* | 5/2022 | Lichtenwalner | H10D 30/0297 |
| 2023/0062475 A1* | 3/2023 | Kumada | H01L 29/66068 |
| 2024/0234570 A1* | 7/2024 | Takahashi | H01L 29/407 |

* cited by examiner

GATE TRENCH POWER SEMICONDUCTOR DEVICES HAVING IMPROVED BREAKDOWN PERFORMANCE AND METHODS OF FORMING SUCH DEVICES

FIELD

The present invention relates to semiconductor devices and, more particularly, to gate trench power semiconductor devices.

BACKGROUND

The Metal Insulating Semiconductor Field Effect Transistor ("MISFET") is a well-known type of semiconductor transistor that may be used as a switching device. A MISFET is a three terminal device that has gate, drain and source terminals and a semiconductor body. A source region and a drain region are formed in the semiconductor body that are separated by a channel region, and a gate electrode (which is often referred to as a gate finger) is separated from the channel region by a thin insulating layer that is referred to as a "gate dielectric layer." A MISFET may be turned on or off by applying an appropriate bias voltage to the gate finger. When a MISFET is turned on (i.e., it is in its "on-state"), current is conducted through the channel region of the MISFET between the source region and drain regions. When the bias voltage is removed from the gate finger (or reduced below a threshold level, which may be a negative voltage in some cases), the current ceases to conduct through the channel region. By way of example, an n-type MISFET has n-type semiconductor source and drain regions and a p-type semiconductor channel region. An n-type MISFET thus has an "n-p-n" design. An n-type MISFET turns on when a gate bias voltage is applied to the gate finger that is sufficient to create a conductive n-type inversion layer in the p-type channel region that electrically connects the n-type source and drain regions, thereby allowing for majority carrier conduction therebetween.

In most cases, the gate dielectric layer that separates the gate finger of a power MISFET from the channel region is implemented as a thin oxide layer (e.g., a silicon oxide layer). A MISFET that has an oxide gate dielectric layer is referred to as a Metal Oxide Semiconductor Field Effect Transistor ("MOSFET"). As oxide-based gate dielectric layers are almost always used due to their superior properties, the discussion herein will focus on MOSFETs as opposed to MISFETs, but it will be appreciated that the techniques according to embodiments of the present invention that are described herein are equally applicable to devices having gate dielectric layers formed with materials other than oxides.

Because the gate finger of a MOSFET is insulated from the channel region by the gate dielectric layer, minimal gate current is required to maintain the MOSFET in its on-state or to switch a MOSFET between its on-state and its off-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate of the MOSFET with small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate of the MOSFET).

There is an increasing demand for high power semiconductor switching devices that can pass large currents in their on-state and block large voltages (e.g., hundreds or thousands of volts) in their reverse blocking state. In order to support high current densities and block such high voltages, power MOSFETs and IGBTs typically have a vertical structure with the source and drain on opposite sides of (e.g., on top and bottom) a thick semiconductor layer structure in order to block higher voltage levels. In very high power applications, the semiconductor switching devices are typically formed in wide band-gap semiconductor material systems (herein the term "wide band-gap semiconductor" encompasses any semiconductor having a band-gap of at least 1.4 electron volts) such as, for example, silicon carbide ("SiC"), which has a number of advantageous characteristics including, for example, a high electric field breakdown strength, high thermal conductivity, high electron mobility, high melting point and high-saturated electron drift velocity. Relative to devices formed using other semiconductor materials such as, for example, silicon, power semiconductor devices formed using silicon carbide may have the capability of operating at higher temperatures, at high power densities, at higher speeds, at higher power levels and/or under high radiation densities.

Vertical power semiconductor devices that include a MOSFET transistor can have a standard gate design in which the gate fingers are formed on top of the semiconductor layer structure or, alternatively, may have the gate fingers buried in respective trenches within the semiconductor layer structure. MOSFETs having buried gate fingers are typically referred to as gate trench MOSFETs. With the standard gate design, the channel region of each unit cell transistor is horizontally disposed underneath a gate finger. In contrast, in the gate trench MOSFET design, the channel is vertically disposed. Gate trench MOSFETs may provide enhanced performance, but typically require a more complicated manufacturing process.

One failure mechanism for a power MOSFET is so-called "breakdown" of the gate dielectric layer. When power MOSFETs are in their conducting or on-state, the gate dielectric layer is subjected to high electric fields. The stress on the gate dielectric layer caused by these electric fields generates defects in the dielectric material that build up over time. When the concentration of defects reaches a critical value, a so-called "percolation path" may be created through the gate dielectric layer that electrically connects the gate finger to the underlying source region, thereby short-circuiting the gate finger and the source region, which can destroy the device. The "lifetime" of a gate dielectric layer (i.e., how long the device can be operated before breakdown occurs) is a function of, among other things, the magnitude of the electric field that the gate dielectric layer is subjected to and the length of time for which the electric field is applied. FIG. 1 is a schematic semi-log graph illustrating the relationship between the operating time until breakdown occurs (the "gate dielectric lifetime") and the level of the electric field applied to the gate dielectric layer. This graph assumes that the same electric field is always applied (which is not necessarily the case), and assumes a gate dielectric layer having a certain thickness. The important point to take from FIG. 1 is that the log of the gate dielectric lifetime and the electric field can have a straight-line relationship, and thus as the electric field level is increased, the lifetime of the gate dielectric layer may decrease. The lifetime of the gate dielectric layer may be increased by increasing the thickness of the gate dielectric layer, but the performance of the MOSFET also is a function of the thickness of the gate dielectric layer and thus increasing the thickness of the gate dielectric layer is typically not an acceptable way of increasing the lifetime of the gate dielectric layer.

Power silicon carbide based MOSFETs are in use today for applications requiring high voltage blocking. By way of example, silicon carbide MOSFETs are commercially available that are rated for current densities of 10 A/cm$^2$ or more that will block voltages from 300 V to 20 kV or higher. To form such devices, a plurality of "unit cells" are typically formed, where each unit cell includes a MOSFET transistor. In high power applications, a large number of these unit cells (e.g., hundreds or thousands) are typically provided on/in a semiconductor layer structure and electrically connected in parallel. A gate pad is formed on a top side of the semiconductor layer structure that is connected to the individual gate fingers through one or more gate buses so that the gate pad can deliver a gate signal to all of the unit cells. The opposite (bottom) side of the semiconductor layer structure acts as a common drain for all of the unit cells of the device. A common source contact is formed on source regions in the semiconductor layer structure that are exposed between the gate fingers. The resulting device has three terminals, namely the common source terminal, a common drain terminal and a common gate terminal that act as the terminals for the hundreds or thousands of individual unit cell transistors that are electrically connected in parallel.

SUMMARY

Pursuant to embodiments of the present invention, semiconductor devices are provided that include a semiconductor layer structure comprising a gate trench formed in an upper surface thereof, a gate finger in the gate trench, a supplemental dielectric layer on an upper surface of the gate finger and vertically overlaps the gate trench, and a gate connector on an upper surface of the supplemental dielectric layer and on an upper surface of the gate finger.

In some embodiments, the semiconductor device further comprises a gate dielectric layer in the gate trench between the semiconductor layer structure and the gate finger. In some embodiments, the supplemental dielectric layer is thicker than the gate dielectric layer. In some embodiments, the supplemental dielectric layer is at least twice as thick as the gate dielectric layer. In some embodiments, the supplemental dielectric layer vertically overlaps the gate finger for less than half a length of the gate finger.

In some embodiments, the supplemental dielectric layer directly contacts a portion of the gate dielectric layer that at least partially covers an upper corner of the gate trench. In some embodiments, the supplemental dielectric layer also directly contacts the upper surface of the gate finger.

In some embodiments, the gate trench extends longitudinally in the semiconductor layer structure and has a longitudinally-extending lower surface, opposed, longitudinally-extending opposed first and second side walls, and opposed first and second end walls, wherein the gate dielectric layer comprises a first portion that extends upwardly along the first end wall of the gate trench, and wherein the supplemental dielectric layer directly contacts the first portion of the gate dielectric layer.

In some embodiments, the gate finger extends longitudinally in the gate trench and has a longitudinally-extending upper surface, a longitudinally-extending lower surface, opposed, longitudinally-extending first and second side walls, and opposed first and second end walls, and wherein the supplemental dielectric layer extends over the first end wall of the gate finger.

In some embodiments, the semiconductor device further comprises an intermetal dielectric layer that is on an upper surface of the gate connector and a source contact on an upper surface of the intermetal dielectric layer. In some embodiments, the intermetal dielectric layer vertically overlaps the supplemental dielectric layer. In some embodiments, the semiconductor device further comprises a gate bus, wherein the gate connector electrically connects the gate bus to the gate finger, and the gate connector is between the supplemental dielectric layer and the intermetal dielectric layer.

In some embodiments, the supplemental dielectric layer is a field oxide layer, the semiconductor device further comprising a gate bus that is on an upper surface of the supplemental dielectric layer.

In some embodiments, the semiconductor device further comprises a gate pad which is electrically connected to the gate finger through the gate bus and the gate connector.

In some embodiments, the supplemental dielectric layer is also on an upper surface of a portion of the semiconductor layer structure that is in an inactive area of the semiconductor device that is at an end of the gate trench.

In some embodiments, the semiconductor device comprises a metal oxide semiconductor field effect transistor, wherein the semiconductor layer structure comprises a silicon carbide drift layer having a first conductivity type, a silicon carbide well having a second conductivity type in an upper portion of the silicon carbide drift layer and a silicon carbide source region having the first conductivity type in an upper portion of the silicon carbide well, and the gate finger comprises silicon.

In some embodiments, the supplemental dielectric layer comprises at least a portion of a second dielectric layer that directly contacts an upper surface of the semiconductor layer structure adjacent a sidewall of the gate trench, wherein a thickness of the second dielectric layer exceeds a thickness of the gate dielectric layer. In some embodiments, the supplemental dielectric layer extends on the semiconductor layer structure adjacent the sidewall of the gate trench for the full length of the gate trench. In some embodiments, a thickness of the supplemental dielectric layer is at least twice a thickness of the gate dielectric layer.

In some embodiments, the supplemental dielectric layer vertically overlaps the gate finger along substantially the entire length of the gate finger. In some embodiments, the supplemental dielectric layer directly contacts the gate finger along substantially the entire length of the gate finger.

In some embodiments, the semiconductor device further comprises a gate bond pad and a gate bus, the gate finger being electrically connected to the gate bond pad through at least the gate connector and the gate bus, wherein the supplemental dielectric layer extends underneath both the gate bond pad and the gate bus.

In some embodiments, the supplemental dielectric layer extends laterally across a full width of the gate finger in at least a portion of an inactive region of the semiconductor device, and the supplemental dielectric layer extends laterally across less than the full width of the gate finger in at least a portion of an active region of the semiconductor device.

Pursuant to further embodiments of the present invention, semiconductor devices are provided that comprise a semiconductor layer structure comprising a gate trench therein, a gate finger in the gate trench, a gate dielectric layer in the gate trench between the semiconductor layer structure and the gate finger, a gate finger in the gate trench, a supplemental dielectric layer on an upper surface of the gate dielectric layer and on an upper surface of the gate finger, and an intermetal dielectric layer that vertically overlaps the supplemental dielectric layer.

In some embodiments, the supplemental dielectric layer vertically overlaps the gate trench.

In some embodiments, the supplemental dielectric layer directly contacts a portion of the gate dielectric layer that at least partially covers an upper corner of the gate trench.

In some embodiments, the gate trench extends longitudinally in the semiconductor layer structure and has a longitudinally-extending lower surface, opposed, longitudinally-extending opposed first and second side walls, and opposed first and second end walls, wherein the gate dielectric layer comprises a first portion that extends upwardly along the first end wall of the gate trench, and wherein the supplemental dielectric layer directly contacts the first portion of the gate dielectric layer.

In some embodiments, the supplemental dielectric layer is at least four times as thick as the gate dielectric layer.

In some embodiments, the semiconductor device further comprises a gate bus and a gate connector that electrically connects the gate finger to the gate bus, wherein the gate connector is between the supplemental dielectric layer and the intermetal dielectric layer.

In some embodiments, the semiconductor device further comprises a gate bond pad and a gate bus, the gate finger being electrically connected to the gate bond pad through at least the gate bus, wherein the supplemental dielectric layer comprises a field oxide layer that extends underneath both the gate bond pad and the gate bus.

In some embodiments, the supplemental dielectric layer comprises at least a portion of a second dielectric layer that directly contacts an upper surface of the semiconductor layer structure adjacent a sidewall of the gate trench, wherein a thickness of the second dielectric layer is at least twice a thickness of the gate dielectric layer. In some embodiments, the supplemental dielectric layer extends on the semiconductor layer structure adjacent the sidewall of the gate trench for the full length of the gate trench. In some embodiments, the supplemental dielectric layer vertically overlaps the gate finger along substantially the entire length of the gate finger.

In some embodiments, the supplemental dielectric layer extends laterally across a full width of the gate finger in at least a portion of an inactive region of the semiconductor device, and the supplemental dielectric layer extends laterally across less than the full width of the gate finger in at least a portion of an active region of the semiconductor device.

Pursuant to further embodiments of the present invention, semiconductor devices are provided that comprise a semiconductor layer structure having a gate trench therein, a gate finger in the gate trench, a gate bus, a gate connector that electrically connects the gate finger to the gate bus, and a supplemental dielectric layer interposed in between an end portion of the gate finger and the gate connector.

In some embodiments, the gate connector directly contacts both the gate finger and the supplemental dielectric layer.

In some embodiments, the semiconductor device further comprises a gate dielectric layer in the gate trench between the semiconductor layer structure and the gate finger. In some embodiments, the supplemental dielectric layer directly contacts a portion of the gate dielectric layer that at least partially covers an upper corner of the gate trench. In some embodiments, the supplemental dielectric layer also directly contacts the upper surface of the gate finger. In some embodiments, the supplemental dielectric layer is at least twice as thick as the gate dielectric layer.

In some embodiments, the semiconductor device further comprises an intermetal dielectric layer that is on an upper surface of the gate connector and a source contact on an upper surface of the intermetal dielectric layer. In some embodiments, the intermetal dielectric layer vertically overlaps the supplemental dielectric layer.

In some embodiments, the semiconductor device further comprises a gate bond pad and a gate bus, the gate finger being electrically connected to the gate bond pad through at least the gate bus, wherein the supplemental dielectric layer comprises a field oxide layer that extends underneath both the gate bond pad and the gate bus.

In some embodiments, the supplemental dielectric layer comprises at least a portion of a second dielectric layer that directly contacts an upper surface of the semiconductor layer structure adjacent a sidewall of the gate trench, wherein a thickness of the second dielectric layer is at least four times a thickness of the gate dielectric layer. In some embodiments, the supplemental dielectric layer extends on the semiconductor layer structure adjacent the sidewall of the gate trench for the full length of the gate trench.

In some embodiments, the supplemental dielectric layer vertically overlaps the gate finger along substantially the entire length of the gate finger.

In some embodiments, the supplemental dielectric layer extends laterally across a full width of the gate finger in at least a portion of an inactive region of the semiconductor device, and the supplemental dielectric layer extends laterally across less than the full width of the gate finger in at least a portion of an active region of the semiconductor device.

Pursuant to additional embodiments of the present invention, semiconductor devices are provided that comprise a semiconductor layer structure, a gate trench extending longitudinally in an upper surface of the semiconductor layer structure, the gate trench having a longitudinally-extending lower surface, opposed, longitudinally-extending first and second side walls, and opposed first and second end walls, a gate dielectric layer on the lower surface, first and second side walls and first and second end walls of the gate trench, a gate finger in the gate trench, and a supplemental dielectric layer that vertically overlaps the gate trench and that directly contacts a portion of the gate dielectric layer that is on the first end wall of the gate trench.

In some embodiments, the supplemental dielectric layer also directly contacts an upper surface of the gate finger. In some embodiments, the supplemental dielectric layer is at least twice as thick as the gate dielectric layer.

In some embodiments, the semiconductor device further comprises a gate bus, a gate connector and an intermetal dielectric layer, where the gate connector electrically connects the gate finger to the gate bus, and the intermetal dielectric layer is on an upper surface of the gate connector. In some embodiments, the intermetal dielectric layer vertically overlaps the supplemental dielectric layer.

In some embodiments, the semiconductor device further comprises a gate bond pad and a gate bus, the gate finger being electrically connected to the gate bond pad through at least the gate bus, wherein the supplemental dielectric layer comprises a field oxide layer that extends underneath both the gate bond pad and the gate bus.

In some embodiments, the supplemental dielectric layer comprises at least a portion of a second dielectric layer that directly contacts an upper surface of the semiconductor layer structure adjacent a sidewall of the gate trench, wherein a thickness of the second dielectric layer is at least twice a thickness of the gate dielectric layer.

In some embodiments, the supplemental dielectric layer extends on the semiconductor layer structure adjacent the sidewall of the gate trench for the full length of the gate trench.

In some embodiments, the supplemental dielectric layer directly contacts the gate finger along substantially the entire length of the gate finger.

Pursuant to yet additional embodiments of the present invention, semiconductor devices are provided that comprise a semiconductor layer structure comprising a gate trench therein, a first dielectric layer on sidewalls and a bottom surface of the gate trench, a gate finger in the gate trench on the first dielectric layer, and a second dielectric layer on an upper surface of the semiconductor layer structure that directly contacts an upper surface of the first dielectric layer. The second dielectric layer is at least twice as thick as the first dielectric layer.

In some embodiments, the first dielectric layer comprises a first portion of a gate dielectric layer that is in the gate trench.

In some embodiments, the second dielectric layer comprises a combination of a second portion of a gate dielectric layer that extends on an upper surface of the semiconductor layer structure and a supplemental dielectric layer that extends on an upper surface of the second portion of a gate dielectric layer.

In some embodiments, the second dielectric layer comprises a supplemental dielectric layer that extends on an upper surface of the semiconductor layer structure.

In some embodiments, the second dielectric layer extends on the semiconductor layer structure adjacent the sidewall of the gate trench for the full length of the gate trench.

In some embodiments, the gate finger comprises first and second sidewalls that extend in a longitudinal direction of the gate trench, and where the second dielectric layer vertically overlaps both the first sidewall and the second sidewall of the gate finger.

In some embodiments, the gate finger comprises first and second sidewalls that extend in a longitudinal direction of the gate trench, and where the second dielectric layer includes a first portion that vertically overlaps the first sidewall of the gate finger and a second portion that vertically overlaps the second sidewall of the gate finger. In some embodiments, the semiconductor device further comprises a gate connector that electrically connects the gate finger to a gate bus. In some embodiments, a portion of the gate connector is positioned between the first and second portions of the second dielectric layer.

Pursuant to still further embodiments of the present invention, semiconductor devices are provided that comprise a semiconductor layer structure comprising a gate trench therein, a first dielectric layer on sidewalls and a bottom surface of the gate trench, a gate finger in the gate trench on the first dielectric layer, and a second dielectric layer on an upper surface of the semiconductor layer structure that directly contacts and vertically overlaps the gate finger.

In some embodiments, the second dielectric layer is at least twice as thick as the first dielectric layer.

In some embodiments, the semiconductor device further comprises a gate connector that directly contacts both the second dielectric layer and the gate finger.

In some embodiments, the first dielectric layer comprises a first portion of a gate dielectric layer that is in the gate trench.

In some embodiments, the second dielectric layer comprises a combination of a second portion of a gate dielectric layer that extends on an upper surface of the semiconductor layer structure and a supplemental dielectric layer that extends on an upper surface of the second portion of a gate dielectric layer.

In some embodiments, the second dielectric layer comprises a supplemental dielectric layer that extends on an upper surface of the semiconductor layer structure.

In some embodiments, the second dielectric layer directly contacts the gate finger along substantially the entire length of the gate finger.

In some embodiments, the gate finger comprises first and second sidewalls that extend in a longitudinal direction of the gate trench, and where the second dielectric layer includes a first portion that vertically overlaps the first sidewall of the gate finger and a second portion that vertically overlaps the second sidewall of the gate finger.

In some embodiments, the semiconductor device further comprises a gate connector that electrically connects the gate finger to a gate bus, and wherein a portion of the gate connector is positioned between the first and second portions of the second dielectric layer.

In some embodiments, the at least a portion of the second dielectric layer extends laterally across a full width of the gate finger in at least a portion of an inactive region of the semiconductor device, and the at least the portion of the supplemental dielectric layer extends laterally across less than the full width of the gate finger in at least a portion of an active region of the semiconductor device.

Pursuant to yet additional embodiments of the present invention, methods of forming a semiconductor device are provided. Pursuant to these methods, a gate trench is formed in a semiconductor layer structure. A gate dielectric layer is formed in the gate trench. A gate finger is formed in the gate trench on the gate dielectric layer. A supplemental dielectric layer is formed on the gate finger and on the gate dielectric layer. A gate bus is formed on the supplemental dielectric layer.

In some embodiments, the supplemental dielectric layer is formed on a portion of the gate finger that is in the gate trench.

In some embodiments, the supplemental dielectric layer vertically overlaps the gate trench.

In some embodiments, the method further comprises forming a gate connector on the supplemental dielectric layer. In some embodiments, the supplemental dielectric layer is interposed between the gate connector and the gate finger. In some embodiments, the gate connector extends between the gate bus and the gate finger and electrically connects the gate finger to the gate bus.

In some embodiments, the supplemental dielectric layer extends over the gate trench for less than half a length of the gate trench.

In some embodiments, the supplemental dielectric layer extends substantially the full length of the gate trench and vertically overlaps the gate trench along substantially the full length of the gate trench.

In some embodiments, the supplemental dielectric layer extends substantially the full length of the gate trench and vertically overlaps the gate finger along substantially the full length of the gate trench.

BRIEF DESCRIPTION OF DRAWINGS

FIGS. 5A-20A are schematic top views corresponding to FIG. 4A that illustrate a method of fabricating the MOSFET of FIGS. 4A-4D.

FIGS. 5B-20B are schematic cross-sectional views taken along gate trenches of FIGS. 5A-20A, respectively.

FIGS. 5C-20C are schematic cross-sectional views taken in between two gate trenches of FIGS. 5A-20A, respectively.

FIGS. 5D-20D are schematic cross-sectional views taken across the gate trenches of FIGS. 5A-20A, respectively.

DETAILED DESCRIPTION

Figure 1:
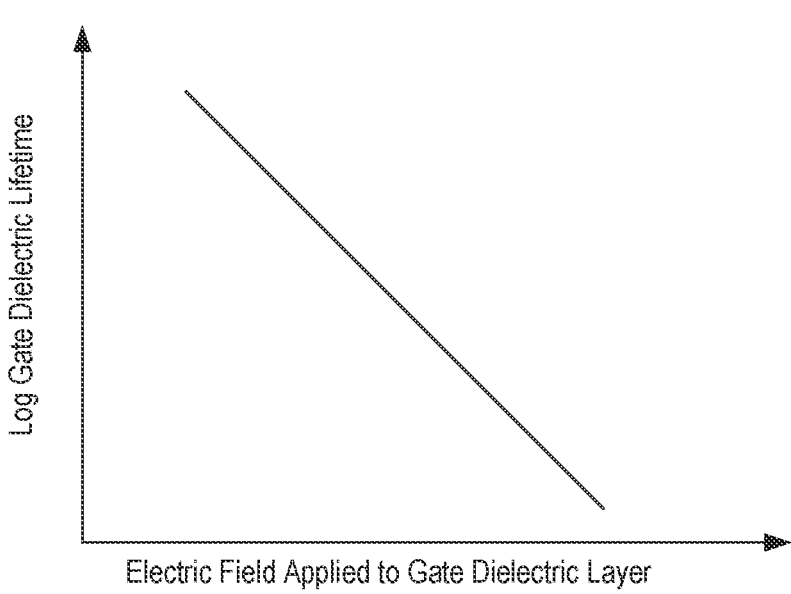
FIG. 1 is a semi-log graph illustrating the relationship between the lifetime of a gate dielectric layer as a function of applied electric field strength.

Vertical silicon carbide based power semiconductor devices that have gate trenches such as vertical power MOSFETs and IGBTs are attractive for many applications due to their inherent lower specific on-resistance, which may result in more efficient operation for power switching operations. Gate trench vertical power devices exhibit lower specific resistance during on-state operation because the channel is formed in the sidewall of the gate trench. Moreover, the carrier mobility in the sidewall channels of gate trench power devices may be about 2-4 times higher than the corresponding carrier mobility in the horizontal channel of a standard (i.e., non-gate trench) vertical power device. This increased channel mobility results in increased current density during on-state operation allowing for higher switching speeds. Furthermore, the trench design reduces the overall pitch of the device, allowing for increased integration. The lower conduction losses (due to the reduced on-state resistance) and improved switching speeds make gate trench power devices well-suited for high frequency power applications having low to moderate voltage blocking requirements (e.g., 600-1200 Volts). These devices may have reduced requirements for associated passive components, low cost, low weight and require relatively simple cooling schemes. As MOSFETs are the most widely used silicon carbide based trenched power semiconductor gate devices, the discussion below focuses primarily on MOSFET embodiments. It will be appreciated, however, that each of the described embodiments may alternatively be implemented using non-oxide gate dielectric layers (e.g., nitrides, high dielectric constant materials, etc.), and that the same techniques may be used to form other gate trench power semiconductor devices such as IGBTs, gate-controlled thyristors and the like.

Gate trench power MOSFETs are susceptible to oxide reliability issues due to the presence of high electric fields in the gate oxide layers that line the bottoms and sidewalls of the gate trenches. The high electric fields degrade the gate oxide layer over time, and may eventually result in failure of the device. The highest electric fields occur in lower and upper corner regions of the gate oxide layer where electric field crowding effects can dramatically increase the levels of the electric field in the gate oxide layer. When gate trench MOSFETs operate in reverse blocking operation (i.e., when the MOSFET is in its off-state), the electric fields extend upwardly from the drain terminal (which is on the bottom surface of the semiconductor layer structure) toward the top surface of the semiconductor layer structure. Thus, under reverse blocking operation, the bottom portion of the gate dielectric layer experiences the high electric field levels, with the electric fields being the highest along the lower corners of the gate oxide layer that are formed at the bottom edges of the gate trench. So-called "trench shielding regions" (which are highly doped semiconductor layers having the same conductivity type as the channel region) are typically provided underneath and/or beside the gate trenches of gate trench power MOSFETs in order to reduce the electric field levels in the gate oxide layer during reverse blocking operation.

During on-state or "forward" operation, the electric fields are highest in the upper portions of the gate oxide layer. Typically, the gate fingers are recessed so that the top surface of each gate finger is within the gate trench (i.e., below the top surface of the semiconductor layer structure), which reduces the electric fields in the upper corners of the gate oxide layer. However, at the ends of the gate trenches where the gate fingers connect to the gate buses, the gate structure necessarily extends over the gate oxide layer in the upper corner region in order to provide the electrical connections between each gate finger and the gate bus(es). Thus, the upper corners of the gate oxide layer at one or both ends of the gate trenches may be the portion(s) of the gate dielectric layer that are most susceptible to breakdown during on-state operation.

Another potential problem with conventional gate trench power MOSFETs is that a field oxide layer that is formed underneath the gate buses can be laterally undercut during the fabrication process. Such lateral undercutting can occur because the field oxide layer is blanket deposited on the device, and hence is formed within the gate trenches. A wet etch is performed to remove the field oxide layer from the gate trenches. Unfortunately, it may be difficult to control this wet etching process and, as a result, lateral undercutting of the field oxide layer may occur underneath the gate buses. When this occurs, it may cause the photoresist that is used during the wet etch to lift off, and/or there may be uniformity issues from wafer to wafer, which is undesirable.

Pursuant to embodiments of the present invention, gate trench power semiconductor devices are provided that have gate dielectric layers that are reinforced at the upper corners thereof at one or both ends of the gate trenches. In some embodiments, these reinforced gate dielectric layers may comprise both a conventional gate dielectric layer as well as a supplemental dielectric layer that overlies the conventional gate dielectric layer. Since the reinforced dielectric layer may be thicker than a conventional dielectric layer (and often multiple times thicker), it may provide increased protection against oxide breakdown at the upper corners of the of the ends of the gate trenches. Thus, the gate trench power semiconductor devices according to embodiments of the present invention may exhibit increased lifetimes. Additionally, the wet etch that is performed to remove the field oxide from the gate trenches can be omitted in fabricating the gate trench power semiconductor devices according to embodiments of the present invention. As such, the potential lateral undercutting of the field oxide layer underneath the gate buses that may occur during such a wet etch can be avoided. This further increases the reliability of the gate trench power semiconductor devices according to embodiments of the present invention.

Pursuant to further embodiments of the present invention, the reinforced gate dielectric layers may extend on the top surface of the semiconductor layer structure along the length of the gate trenches, thereby providing increased protection against breakdown of the gate dielectric layer along the entire length of the upper corners of the gate trenches. In some embodiments, this may be achieved by having the supplemental dielectric layer vertically overlap the portions of each gate dielectric layer that extend on the sidewalls of the respective gate trenches, thereby "thickening" the top portion of each gate dielectric layer along the entire length of each gate trench. In other embodiments, the supplemental dielectric layer may also extend laterally to vertically overlap the gate fingers. Such embodiments may provide even greater protection against dielectric breakdown.

Before discussing the gate trench power semiconductor devices according to embodiments of the present invention and the methods of forming such devices, it is helpful to review a conventional gate trench power semiconductor device.

Figure 2A:
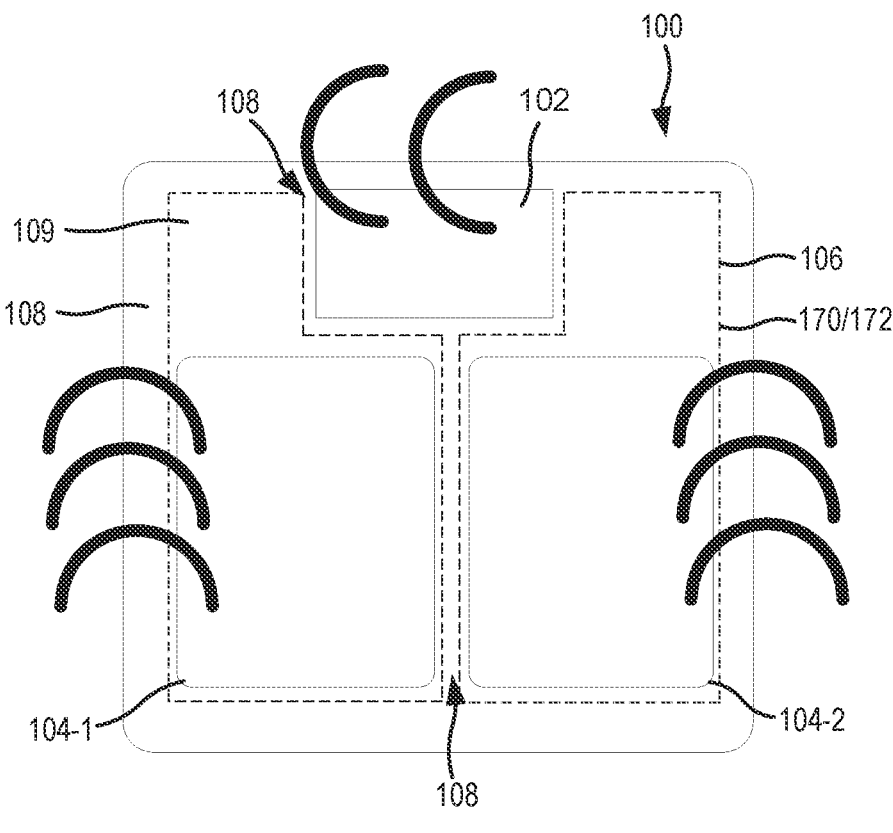
FIG. 2A is a schematic top view of a conventional silicon carbide MOSFET.
Figure 2B:
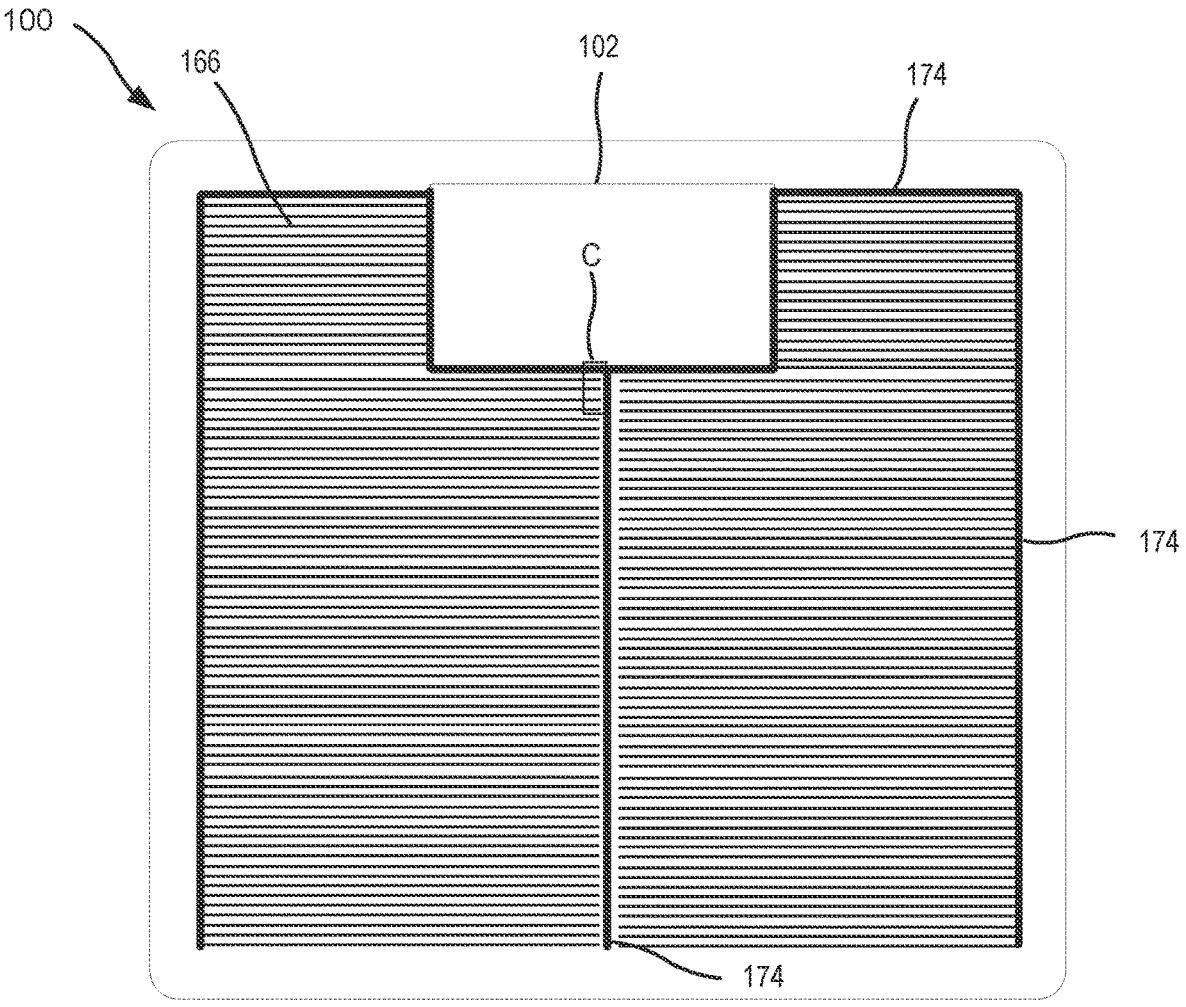
FIG. 2B is a schematic top view of the conventional silicon carbide MOSFET of FIG. 2A with various of the upper metal and dielectric layers removed.
Figures 3A, 3B, 3C, 3D:
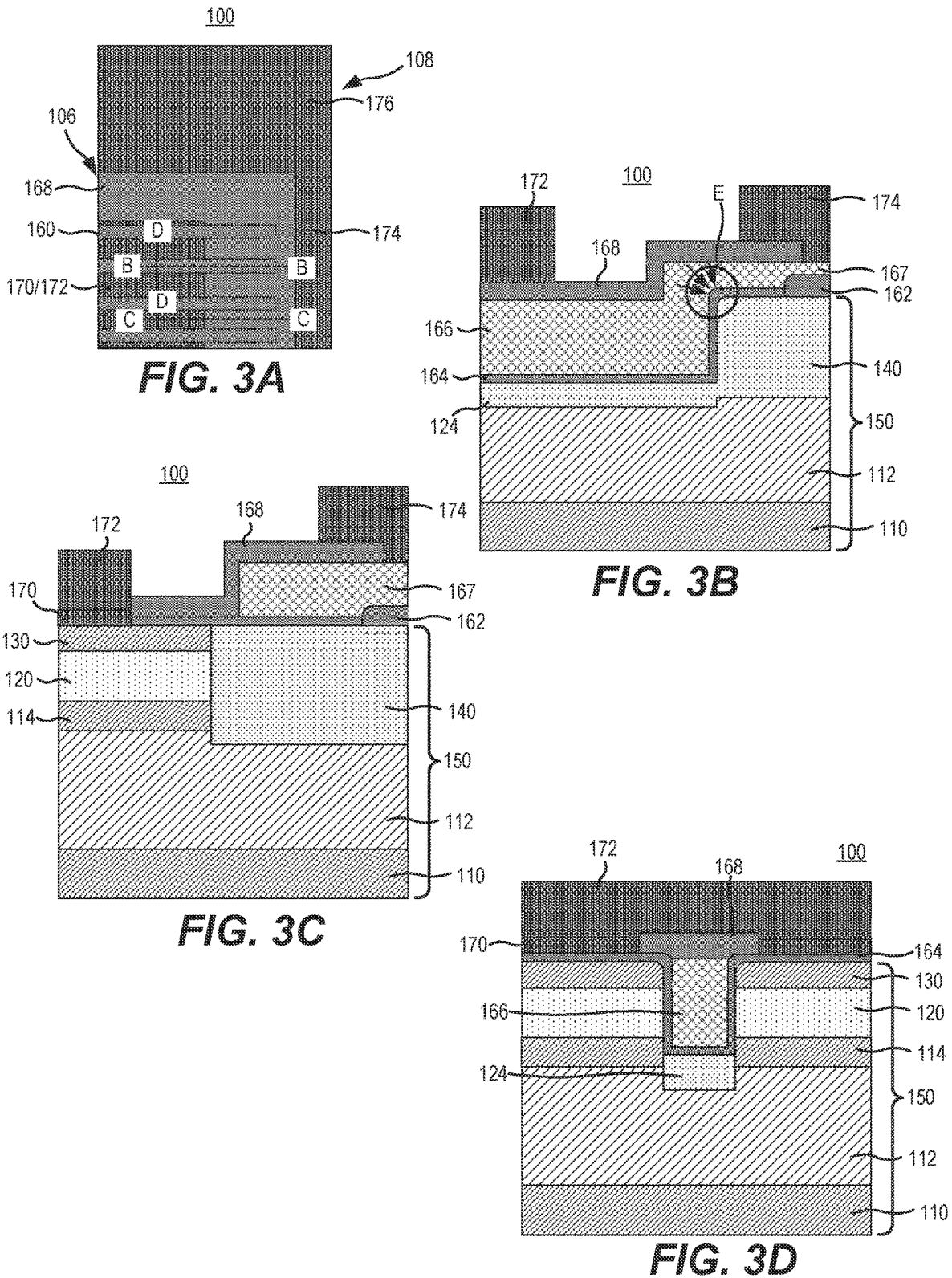
FIG. 3A is a greatly enlarged view of a portion C of the top view of FIG. 2B.
FIG. 3B is a schematic cross-sectional view taken along line B-B of FIG. 3A.
FIG. 3C is a schematic cross-sectional view taken along line C-C of FIG. 3A.
FIG. 3D is a schematic cross-sectional view taken along line D-D of FIG. 3A.

FIG. 2A is a schematic top view of a conventional power MOSFET 100. FIG. 2B is a schematic plan view of the power MOSFET 100 with various top-side metal and dielectric layers thereof omitted to show the gate fingers and gate buses. FIG. 3A is a greatly enlarged view of a portion C of the top view of FIG. 2B. FIGS. 3B-3D are schematic cross-sectional view taken along lines B-B, C-C and D-D, respectively, of FIG. 3A. It will be appreciated that the thicknesses of various of the layers, patterns and elements in FIGS. 3A-3D and the other figures herein are not necessarily drawn to scale.

Referring first to FIGS. 3B-3D, it can be seen that the power MOSFET 100 includes a semiconductor layer structure 150 and a plurality of metal and dielectric layers that are formed on either side of the semiconductor layer structure 150.

Referring to FIG. 2A, a gate bond pad 102 and one or more source bond pads 104-1, 104-2 are formed on the upper side of the semiconductor layer structure 150, and a drain pad (not shown) may be provided on the bottom side of the MOSFET 100. Each of the gate and source pads 102, 104 may be formed of a metal, such as aluminum, that bond wires can be readily attached to via conventional techniques such as thermo-compression or soldering. A protective layer 109 such as a polyimide layer may cover the entire top surface of MOSFET 100 except for the gate and source pads 102, 104.

The MOSFET 100 includes a source contact 170/172 (indicated by the dashed boxes in FIG. 2A) that electrically connects source regions 130 (FIGS. 3B-3D) in the semiconductor layer structure 150 to the source bond pads 104-1, 104-2. The source bond pads 104-1, 104-2 may be portions of the source contact 170/172 that are exposed through openings in the protective layer 109 in some embodiments. The source contact 170/172 may generally overlie or correspond to an "active region" 106 of the MOSFET where the unit cell transistors are located. An inactive region 108 of MOSFET 100 surrounds the active region 106. The inactive region 108 may include a termination region that extends around the periphery of the device that includes guard rings, junction termination elements or other termination structures, a gate pad region that underlies the gate pad 102, and gate bus regions (discussed below).

Bond wires are shown in FIG. 2A that may be used to connect the gate bond pad 102 and the source bond pads 104 to external circuits or the like. The drain pad (not shown) on the bottom side of MOSFET 100 may be connected to an external circuit through, for example, an underlying submount (not shown).

Referring to FIG. 2B, the MOSFET 100 further includes a plurality of gate fingers 166 that are connected to the gate pad 102 via one or more gate buses 174. The gate fingers 166 may comprise, for example, a doped polysilicon pattern. The gate fingers 166 may, for example, extend horizontally across the semiconductor layer structure 150 (as shown in FIG. 2B) or vertically across the semiconductor layer structure 150. Other configurations may be used (e.g., the unit cells may have a hexagonal configuration). The gate fingers 166 are formed within gate trenches in the upper surface of the semiconductor layer structure 150. The gate pad 102 and the gate buses 174 may comprise metal structures in example embodiments and are in the inactive region 108 of MOSFET 100.

FIG. 3A is a greatly enlarged view of a portion "C" of FIG. 2B that illustrates a portion of the MOSFET 100 where several of the gate fingers 166 of MOSFET 100 connect to one of the gate buses 174. As shown in FIG. 3A, the gate bus 174 is connected to a gate pad 176 (which may be the gate bond pad 102 or a separate structure that is electrically connected to the gate bond pad 102). The connection between the gate bus 174 and the gate pad 176 may be a direct connection as shown in FIG. 3A, or alternatively may be through a gate resistor (not shown). A plurality of gate trenches 160 are formed in the semiconductor layer structure 150 and end near the gate bus 174. The source contact 170/172 extends over the gate trenches 160 in the inactive region 108. An intermetal dielectric layer 168 (e.g., a silicon oxide layer) insulates the gate fingers 166, the gate bus 174 and the gate pad 176 from the source contact 170/172.

FIGS. 3B-3D illustrate the layer structure of MOSFET 100. Referring first to FIGS. 3C-3D, the MOSFET 100 includes a substrate 110. The substrate 110 may comprise, for example, a single crystal 4H silicon carbide semiconductor substrate that is heavily-doped with n-type impurities (i.e., an n+ silicon carbide substrate). An n-type silicon carbide drift region 112 is formed on an upper surface of the substrate 110. The n-type silicon carbide drift region 112 may, for example, be formed by epitaxial growth on the silicon carbide substrate 110. The n-type silicon carbide drift region 112 may be a lightly-doped n-type (n) region, and may be referred to herein as either a drift "region" or a drift "layer." In example embodiments, the n-type silicon carbide drift region 112 may have a doping concentration of $1 \times 10^{14}$ to $5 \times 10^{16}$ dopants/cm$^3$. The n-type silicon carbide drift region 112 may be a thick region, having a vertical height above the substrate 110 of, for example, 3-100 microns. An upper portion of the n-type silicon carbide drift region 112 may be more heavily doped (e.g., a doping concentration of $1 \times 10^{16}$ to $1 \times 10^{17}$ dopants/cm 3) than the lower portion thereof to provide a current spreading layer in the upper portion of the n-type silicon carbide drift region 112.

Moderately-doped (p) p-type silicon carbide well regions 120 ("p-wells") are formed on an upper surface of the current spreading layer 114. The p-wells 120 may be formed by, for example, ion implantation. Heavily-doped (n$^+$) n-type silicon carbide source regions 130 are then formed in upper portions of the p-type wells 120 by, for example, ion implantation. As shown in FIGS. 3B and 3D, deep shielding regions 124 are provided within the drift region 112 and the current spreading layer 114. While not visible in the figures (since the deep shielding connection patterns 122 are outside the views shown in the cross-sections of FIGS. 3B-3D), heavily-doped (p$^+$) p-type silicon carbide deep shielding connection patterns 122 are formed that electrically connect the deep trench shielding regions 124 to the source contact 170/172. Finally, a heavily-doped p-type (p) region 140 is formed in an upper portion of the n-type drift region 112 by ion implantation. The heavily-doped p-type (p) region 140 is formed in the inactive region 108 of MOSFET 100. The heavily-doped p-type (p) region 140 is formed is underneath the gate buses 174 and the gate pad 176. The substrate 110, the drift region 112, the current spreading layer 114, the p-wells 120, the deep shielding connection patterns 122, the source regions 130 and the heavily-doped p-type (p) region 140 form the semiconductor layer structure 150. Each of these regions layers may comprise silicon carbide. Thus, the semiconductor layer structure 150 may be a wide bandgap semiconductor layer structure 150.

A plurality of gate trenches 160 are formed in an upper surface of the semiconductor layer structure 150 (e.g., by etching). It will be appreciated that only a small portion of each gate trench 160 is visible in FIG. 3A. A gate dielectric layer 164 lines the bottom surface, sidewalls and end walls of each gate trench 160. Respective gate fingers 166 may substantially fill each gate trench 160, and are separated from the semiconductor layer structure 150 by the gate dielectric layer 164. At the end of the gate trench 160, each gate finger 166 includes a gate finger extension 167 that protrudes out of the gate trench 160 and laterally across the semiconductor layer structure 150. The gate dielectric layer 164 and a field oxide layer 162 separate each gate finger extension 167 from the semiconductor layer structure 150. The gate bus 174 is formed on the gate finger extension 167 to provide the electrical connection between the gate finger 166 and the gate bus 174.

During on-state operation, high electric fields are generated in the portions of the gate dielectric layer 164 that extends along the upper sidewalls and end walls of each gate trench 160. Due to electric field crowding effects, the highest electric fields are generated at the upper corners of the gate trench 160 where the sidewalls and end walls of the gate trench 160 merge with the top surface of the semiconductor layer structure 150. The electric fields along the tops surfaces of the sidewalls of the gate trench 160 can be reduced by recessing the upper surface of the gate finger 166 to be below the upper surface of the gate trench 160. However, at the end of the gate trench 160 where the gate finger extension 167 comes out of the gate trench 160 to connect to the gate bus 174, it is not possible to recess the gate finger 166. As a result, very high electric fields (as shown by the arrows) may be generated in the portion of the gate dielectric layer 164 that is within the region labelled E in FIG. 3B. These high electric fields may breakdown the corner region of the gate dielectric layer 164 that is circled in region E.

It will be appreciated that the upper corners of the gate trench 160 refer to the regions where the opposed sidewalls (or end walls) of the gate trench 160 and the top surface of the semiconductor layer structure 150 meet or intersect, while the lower corners of the gate trench 160 refer to the regions where the opposed sidewalls (or end walls) of the trench 160 and the bottom surface of the gate trench 160 meet or intersect. Thus, it will be appreciated that the "corners" may refer to both two-dimensional corners (as shown in the region E of FIG. 3B) and/or to three-dimensional corners that are present, for example in a cube.

As discussed above, one common failure mechanism in power semiconductor devices is device failure due to breakdown of the gate dielectric layer. The intensity of the electric field that is generated in the gate dielectric layer of a conventional power semiconductor device during on-state operation is not constant. The gate dielectric layer 164 of the MOSFET 100 of FIGS. 3A-3D may be viewed as the dielectric of a U-shaped parallel plate capacitor, with each gate finger 166 acting as the inner plate of the capacitor and the portions of the semiconductor layer structure 150 on the other side of the gate dielectric layer 164 opposite the gate finger 166 acting as the outer plate of the capacitor. The bottom and sidewalls of the U-shaped capacitor will act like standard parallel plate capacitors, and thus during on-state operation, the electric field will have a generally constant value throughout these "parallel-plate" regions of the gate dielectric layer. However, in the lower and upper "corner regions" of the gate dielectric layer 164, which are the portions of the gate dielectric layer 164 that transition from extending vertically to extending horizontally, electric field crowding effects increase the level of the electric field. During off-state (reverse blocking operation), the highest electric fields occur in the lower corners of the gate dielectric layer 164 where the sidewalls of the gate trench 160 merge into the bottom surface thereof. During on-state (forward conduction operation), the highest electric fields occur in the upper corners of the gate dielectric layer 164 where the gate dielectric layer 164 extends from the upper sidewalls and end walls of the gate trench 160 onto the upper surface of the semiconductor layer structure 150. As noted above, the upper surfaces of the gate fingers 166 may be recessed to be below the top surfaces of the gate trenches 160, which reduces the electric fields in the gate dielectric layer 164 along the upper sidewalls of the gate trenches 160. Such recessing, however, cannot occur adjacent at least one end wall of each gate trench 160 as a corresponding gate finger connector 167 necessarily has to extend over the end wall of each gate trench 160 to contact the respective gate finger 166 that is within the gate trench 160 to electrically connect the gate finger 166 to the gate bus 174, as is shown in FIG. 3B.

When a gate bias voltage is applied so that the MOSFET 100 is in its on-state, very high electric fields are formed in the portion of the gate oxide layer 164 that extends vertically on the end wall of the gate trench 160 and then goes through a 90° transition to extend horizontally on the semiconductor layer structure 150. The electric fields are particularly high here due to electric field crowding effects that occur at corner regions of a dielectric layer. This portion of the gate oxide layer 164 is thus particularly susceptible to breakdown.

As discussed above, pursuant to embodiments of the present invention, improved gate trench power semiconductor devices are provided that have thicker dielectric layers lining the end walls of the gate trenches. The provision of thickened dielectric layers adjacent the upper portions of the end walls of the gate trenches allow the electric fields in these regions to spread out more during on-state operation, thereby reducing the levels thereof, and also provide a larger amount of dielectric material between the gate structure and the semiconductor layer structure. As such, the semiconductor devices according to embodiments of the present invention are less susceptible to breakdown.

Figures 4A, 4B, 4C, 4D:
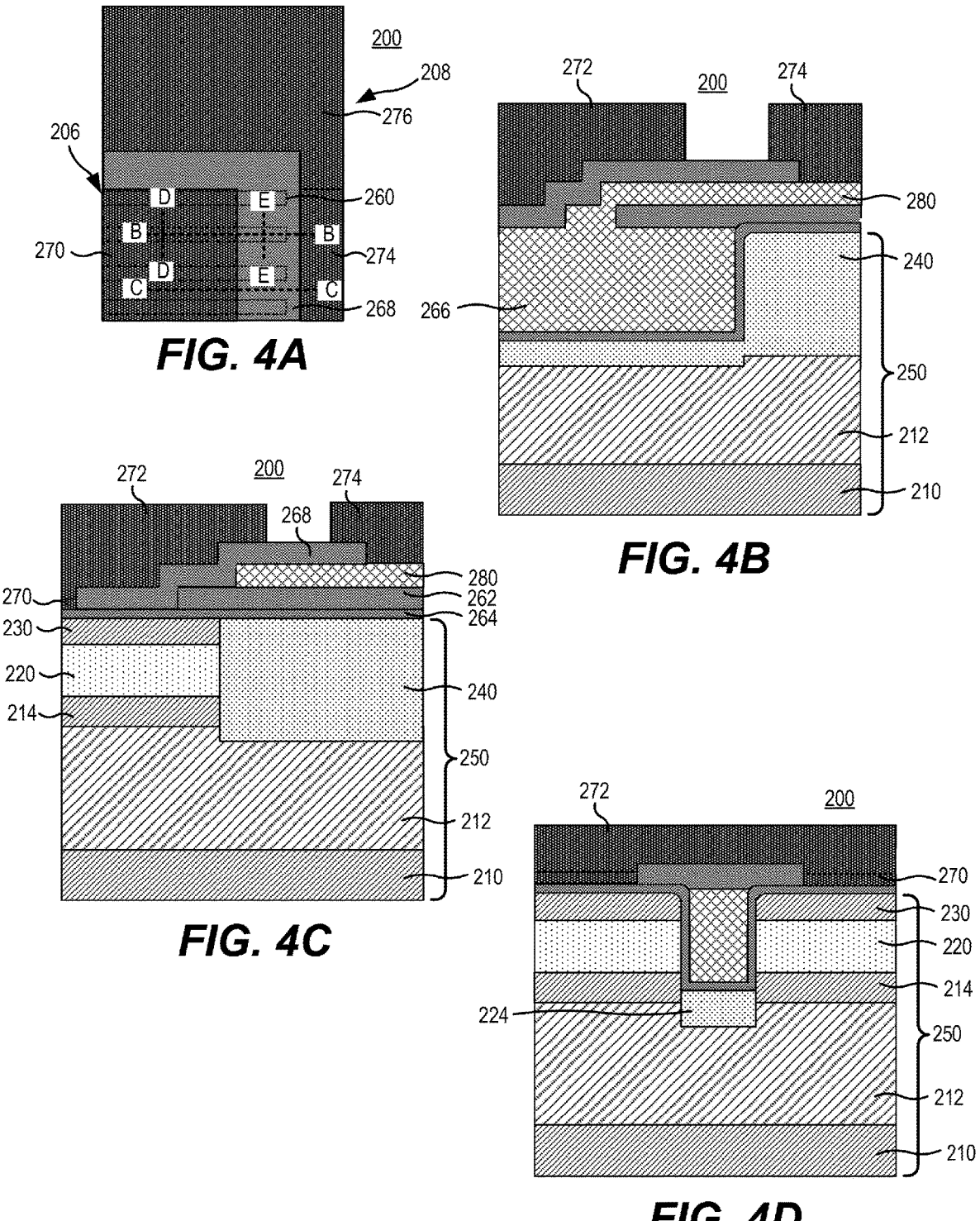
FIG. 4A is a greatly enlarged view of a MOSFET according to embodiments of the present invention, where the view correspond to the portion C shown in FIG. 2B.
FIG. 4B is a schematic cross-sectional view taken along line B-B of FIG. 4A.
FIG. 4C is a schematic cross-sectional view taken along line C-C of FIG. 4A.
FIG. 4D is a schematic cross-sectional view taken along line D-D of FIG. 4A.

FIGS. 4A-4D are various views of a gate trench MOSFET 200 according to embodiments of the present invention. In particular, FIG. 4A is a greatly enlarged view of the MOSFET 200 that illustrates a region of the MOSFET 200 that corresponds to the portion C shown in FIG. 2B (note that while FIGS. 2A and 2B illustrate MOSFET 100, the corresponding views of MOSFET 200 will be identical to what is shown in FIGS. 2A and 2B, and hence corresponding views of MOSFET 200 are not provided or described herein). FIG. 4B is a schematic cross-sectional view taken along line B-B of FIG. 4A. FIG. 4C is a schematic cross-sectional view taken along line C-C of FIG. 4A. Finally, FIG. 4D is a schematic cross-sectional view taken along line D-D of FIG. 4A.

As shown in FIGS. 4B-4D, a silicon carbide drift region 212 is provided on an upper surface of a substrate 210. The substrate 210 may comprise, for example, a single crystal 4H silicon carbide semiconductor substrate that is heavily-doped with n-type impurities (i.e., an n+ silicon carbide substrate). Other polytype silicon carbide substrates may be used, however, as can substrates made of materials other than silicon carbide. The n-type silicon carbide drift region 212 may, for example, be formed by epitaxial growth on the silicon carbide substrate 210. The n-type silicon carbide drift region 212 may be lightly-doped (n) with n-type dopants. For example, the n-type silicon carbide drift region 212 may a doping concentration of $1\times10^{14}$ to $5\times10^{16}$ dopants/cm$^3$. The n-type silicon carbide drift region 212 may be a thick region, having a vertical height above the substrate 210 of, for example, 3-100 microns. An upper portion of the n-type silicon carbide drift region 212 may be more heavily doped (e.g., a doping concentration of $1\times10^{16}$ to $1\times10^{17}$ dopants/cm 3) than the lower portion thereof to provide a current spreading layer 214 in the upper portion of the n-type silicon carbide drift region 212.

Moderately-doped (p) p-type silicon carbide well regions 220 ("p-wells") are formed on an upper surface of the current spreading layer 214. The p-wells 220 may be formed by, for example, ion implantation. Heavily-doped (n$^+$) n-type silicon carbide source regions 230 are then formed in upper portions of the p-type wells 220 by, for example, ion implantation. As shown in FIGS. 4B and 4D, deep shielding regions 224 are provided within the drift region 212 and the current spreading layer 214. While not visible in the figures (since the deep shielding connection patterns 222 are outside the views shown in the cross-sections of FIGS. 4B-4D), heavily-doped (p$^+$) p-type silicon carbide deep shielding connection patterns 222 are formed that electrically connect the deep trench shielding regions 224 to the source contact 270/272. Finally, a heavily-doped p-type (p) region 240 is formed in an upper portion of the n-type drift region 212 by ion implantation. A heavily-doped p-type (p) region 240 is formed in an upper portion of the n-type drift region 212 by ion implantation in at least part of the inactive region 208 of the device (corresponding to region 108 in FIG. 2A). In particular, the heavily-doped p-type (p) region 240 is formed in portions of the inactive region 208 of MOSFET 200 that are underneath the gate buses 274 and a gate pad 276. The substrate 210, the drift region 212, the current spreading layer 214, the p-wells 220, the deep shielding connection patterns 222, the source regions 230 and the heavily-doped p-type (p) region 240 form the semiconductor layer structure 250. Each of these regions layers may comprise silicon carbide. It will be appreciated that the semiconductor layer structure 250 shown in FIGS. 10A-10D is merely an example, and other configurations of the semiconductor layer structure 250 may be used without deviating from the embodiments described herein. For example, the semiconductor layer structure 250 may include additional layers or regions or regions (e.g., the current spreading layer 214) may be omitted.

A plurality of gate trenches 260 are formed in an upper surface of the semiconductor layer structure 250 (e.g., by etching). It will be appreciated that only a small portion of each gate trench 260 is visible in FIG. 4A. A gate dielectric layer 264 lines the bottom surface, sidewalls and end walls of each gate trench 260. The gate dielectric layer 264 also extends onto the heavily-doped p-type (p) region 240. Respective gate fingers 266 may substantially fill each gate trench 260, and are separated from the semiconductor layer structure 250 by the gate dielectric layer 264.

At the end of the gate trench 160, each gate finger 166 includes a gate finger extension 167 that protrudes out of the gate trench 160 and laterally across the semiconductor layer structure 150. The gate dielectric layer 164 and a field oxide layer 162 separate each gate finger extension 167 from semiconductor layer structure 150. The gate bus 174 is formed on the gate finger extension 167 to provide the electrical connection between the gate finger 166 and the gate bus 174. A supplemental dielectric layer 262 extends on the portion of the gate dielectric layer 264 that extends onto the heavily-doped p-type (p) region 240. The supplemental dielectric layer 262 further extends onto an upper surface of the gate finger 266. The supplemental dielectric layer 262 may have a thickness that is, for example, twice as thick to fifteen times as thick as the gate dielectric layer 264. The supplemental dielectric layer 262 may be a field oxide layer in some embodiments.

As described above, the supplemental dielectric layer 262 vertically overlaps both the gate trench 260 and the gate finger 266. Herein, two elements of a semiconductor device "vertically overlap" if an axis that is perpendicular to the bottom surface of the semiconductor layer structure of the device intersect both elements.

As shown best in FIG. 4B, the supplemental dielectric layer 262 increases the amount of dielectric material that is provided at the upper edge of the end of the gate trench 260. This spreads out the electrical fields in this region of the gate dielectric layer 264 during on-state operation. The thicker dielectric material layer in this region of the device also lengthens the time to breakdown as more dielectric material must experience breakdown before the dielectric layer is sufficiently damaged to allow a short circuit between the gate finger 266 and the semiconductor layer structure 250.

Thus, the supplemental dielectric layer 262 may significantly extend the expected life of the MOSFET 200 as compared to the expected life of the MOSFET 100 under identical operating conditions.

FIGS. 5A-5D through FIGS. 20A-20D are various views that illustrate a method of fabricating the MOSFET 200 of FIGS. 4A-4D. In particular, FIGS. 5A-20A are schematic top views corresponding to the region C shown in FIG. 2B. FIGS. 5B-20B are schematic cross-sectional views taken along the corresponding B-B lines of FIGS. 5A-20A, respectively, FIGS. 5C-20C are schematic cross-sectional views taken along the corresponding C-C lines of FIGS. 5A-20A, and FIGS. 5D-20D are schematic cross-sectional views taken along the corresponding D-D lines of FIGS. 5A-20A, respectively. Note that in order to avoid obscuring the drawings, only the cross-section lines are shown in FIGS. 5A-20A, and the labels B-B, C-C and D-D are not shown. It will be appreciated that FIG. 4A includes the labels B-B, C-C and D-D and that the corresponding cross-section lines in FIGS. 5A-20A are the same as shown in FIG. 4A.

Figures 5A, 5B, 5C, 5D:
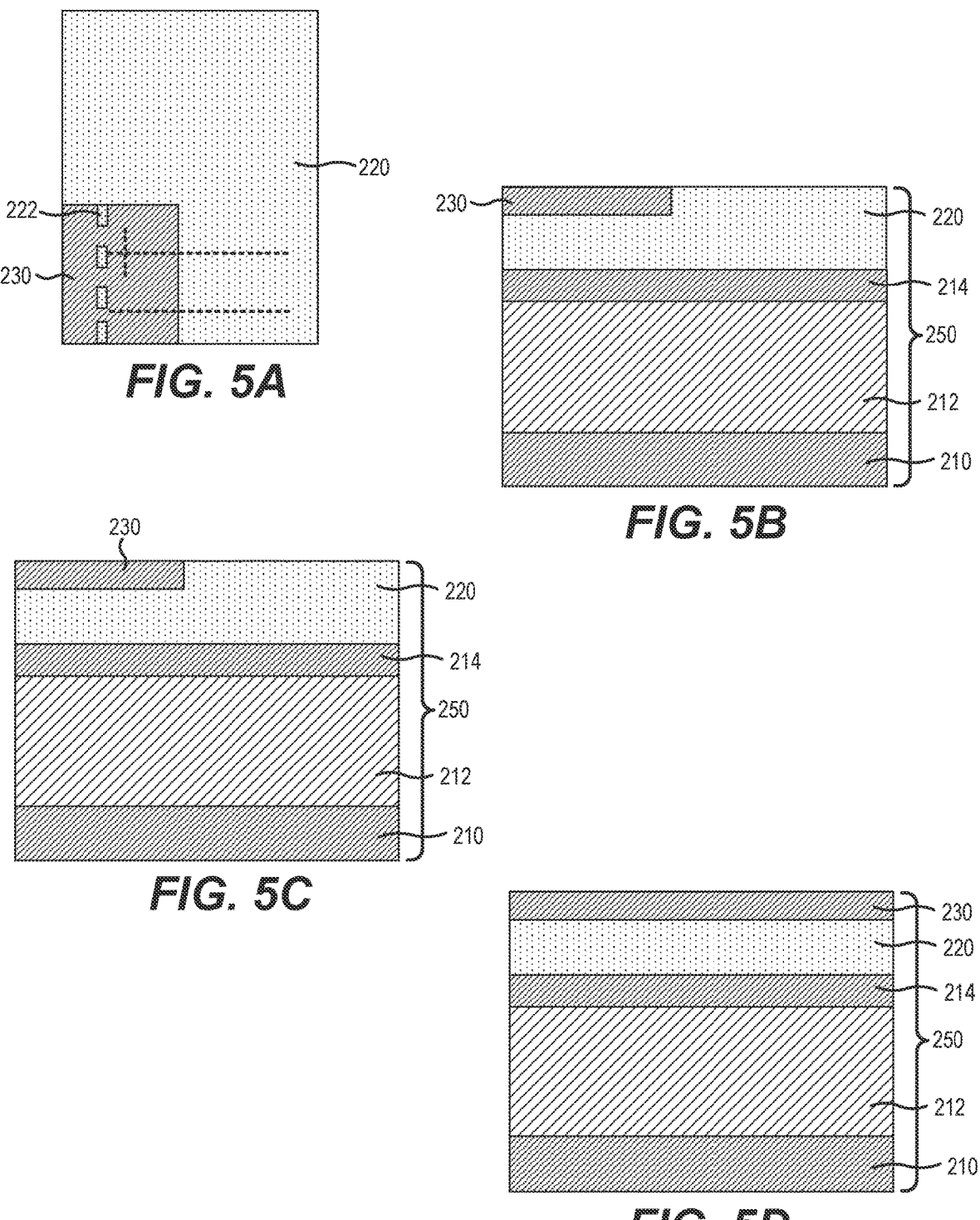
Figures 6A, 6B, 6C, 6D:
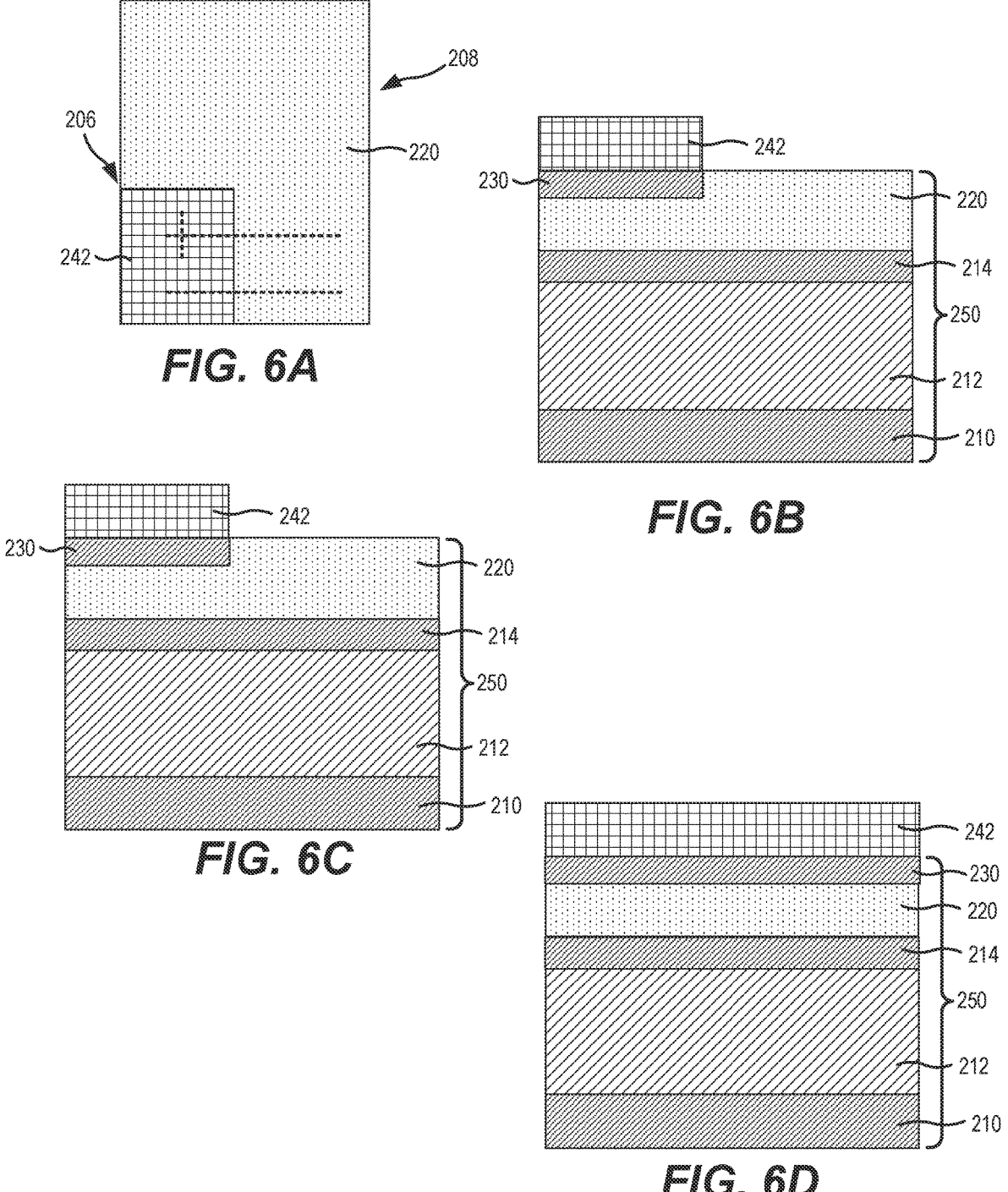
Figures 7A, 7B, 7C, 7D:
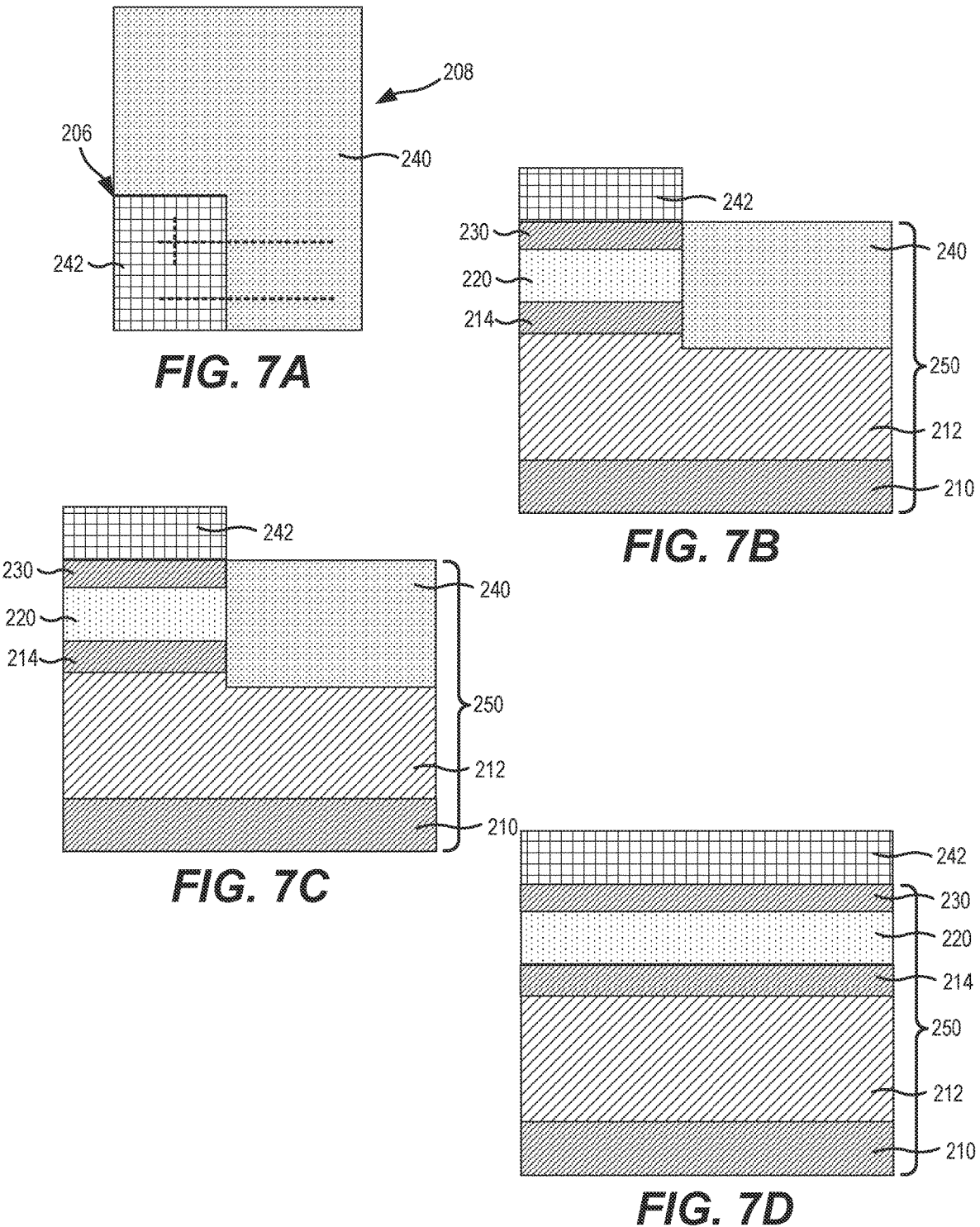
Figures 8A, 8B, 8C, 8D:
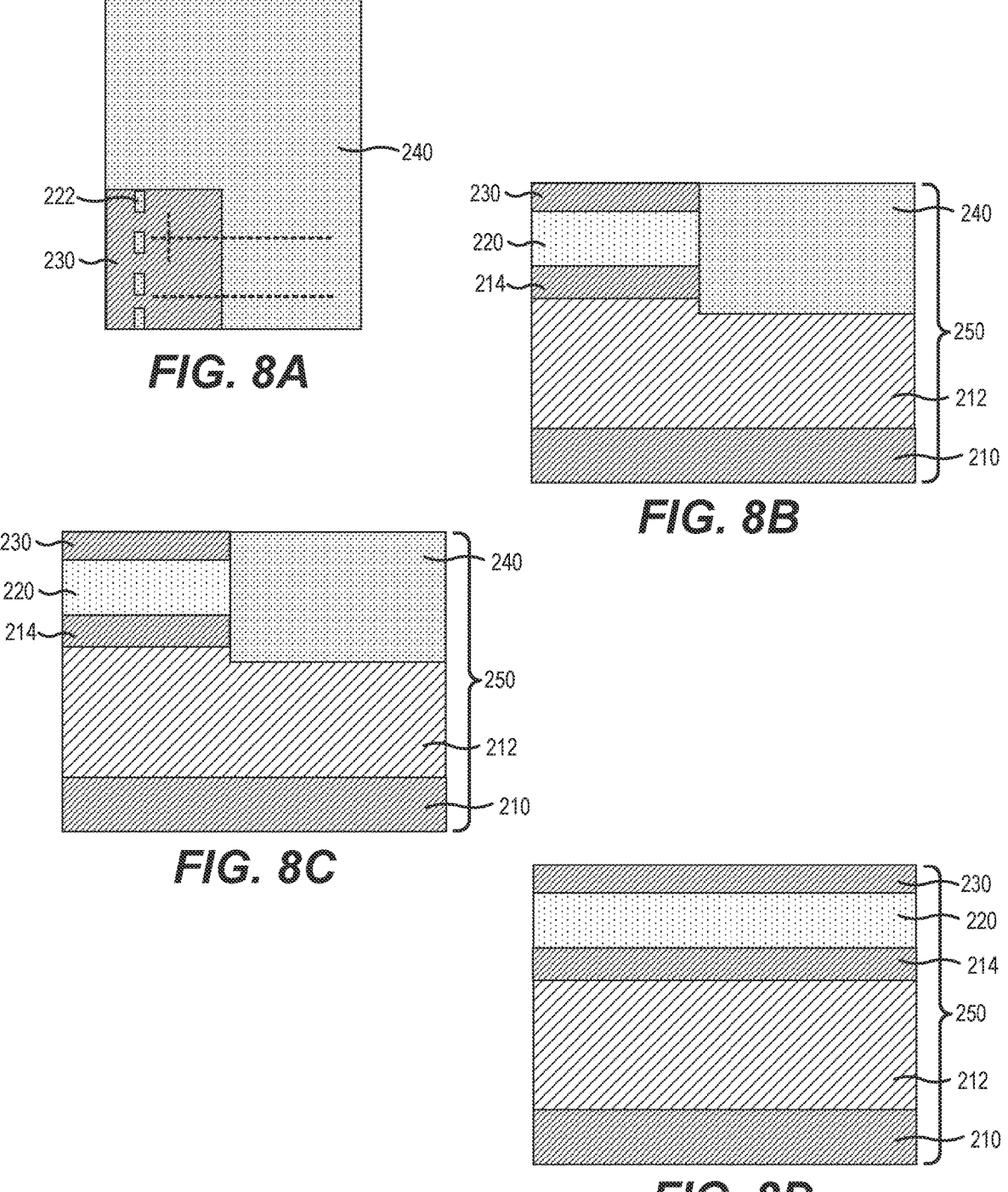

Referring to FIGS. 5A-5D, the lightly-doped n-type drift layer 212 is formed on the heavily-doped n-type semiconductor substrate 210. The n-type current spreading layer 214 that is more heavily doped than the drift layer 212 can optionally be formed in or on the upper portion of the drift layer 212. The moderately-doped (p) p-type silicon carbide p-wells 220 are formed on the current spreading layer 214 by, for example, ion implantation, and the heavily-doped (n$^+$) n-type silicon carbide source regions 230 are then formed in upper portions of the p-wells 220 by, for example, ion implantation. Finally, as shown in FIG. 5A, heavily-doped (p$^+$) p-type silicon carbide deep shielding connection patterns 222 are formed that electrically connect deep trench shielding regions that are formed underneath the gate trenches in a later processing step to the source contact 270/272. The deep shielding connection patterns 222 are outside the views shown in the cross-sections of FIGS. 5B-5D.

Referring to FIGS. 6A-6D, an ion implantation mask (e.g., a photoresist mask) 242 is formed over the active area 206 of the MOSFET 200.

Referring to FIGS. 7A-7D, p-type dopants are implanted via ion implantation into the exposed regions of the semiconductor layer structure 250 to form the above-discussed heavily-doped p-type (p$^+$) region 240 in the inactive region 208 of the MOSFET 200.

Referring to FIGS. 8A-8D, the ion implantation mask 242 may then be removed.

Figures 9A, 9B, 9C, 9D:
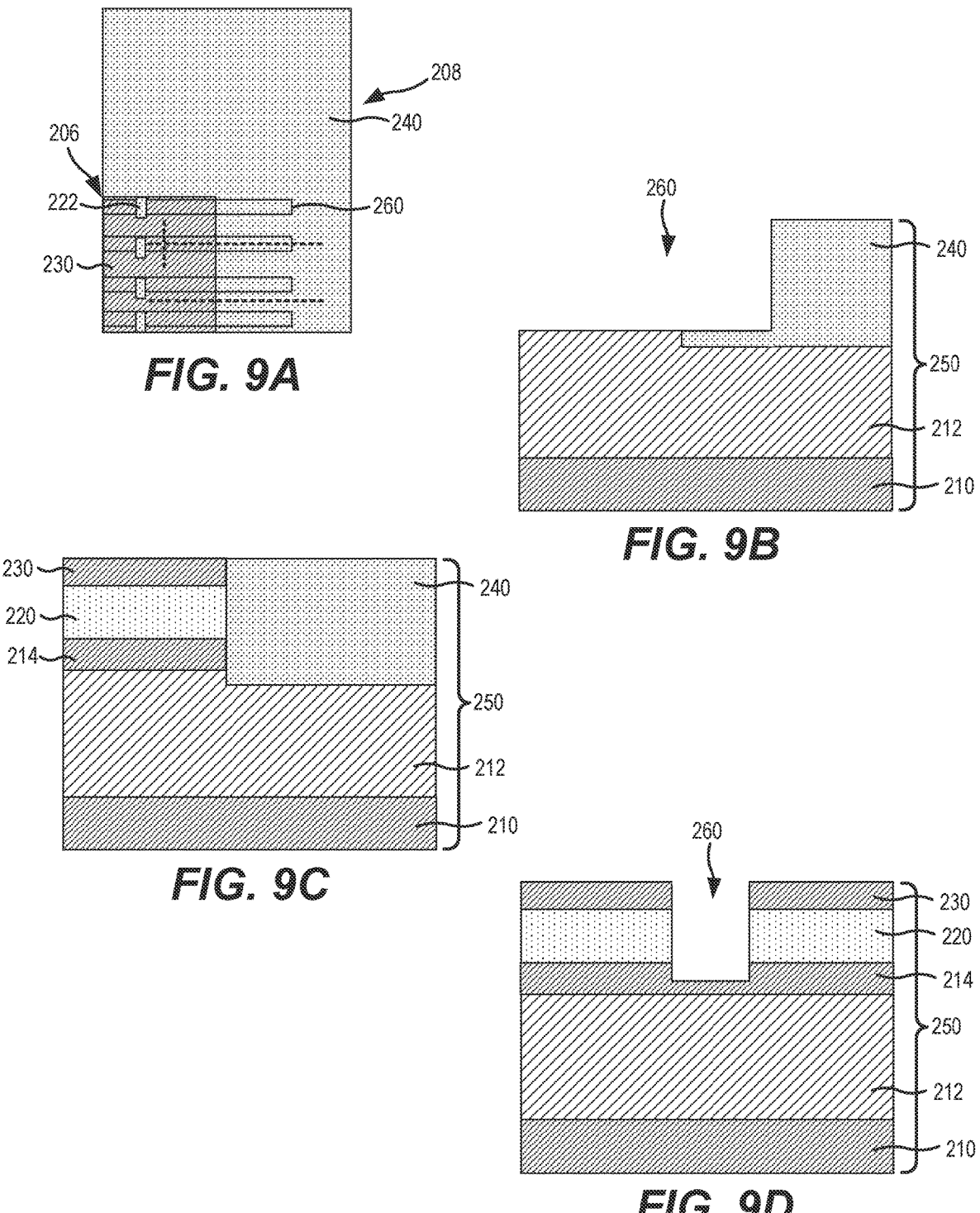

Referring to FIGS. 9A-9D, a plurality of gate trenches 260 are formed in the upper surface of semiconductor layer structure 250. The gate trenches 260 primarily extend across the active region 206 of MOSFET 200, although end portions of the gate trenches 260 may extend into the inactive region 208. As shown in FIGS. 9C-9D, the gate trenches 260 extend vertically through the p-wells 220 and may also extend partly or completely through the current spreading layer 214. Herein, the "vertical" direction is the direction that extends perpendicularly to the major surfaces of the semiconductor layer structure of the device at issue. The gate trenches 260 may have a depth of, for example, between 0.5 and 3.0 microns. Sidewalls of the p-wells 220 that are exposed by the gate trenches 260 will act as channel regions of the completed MOSFET 200.

Figures 10A, 10B, 10C, 10D:
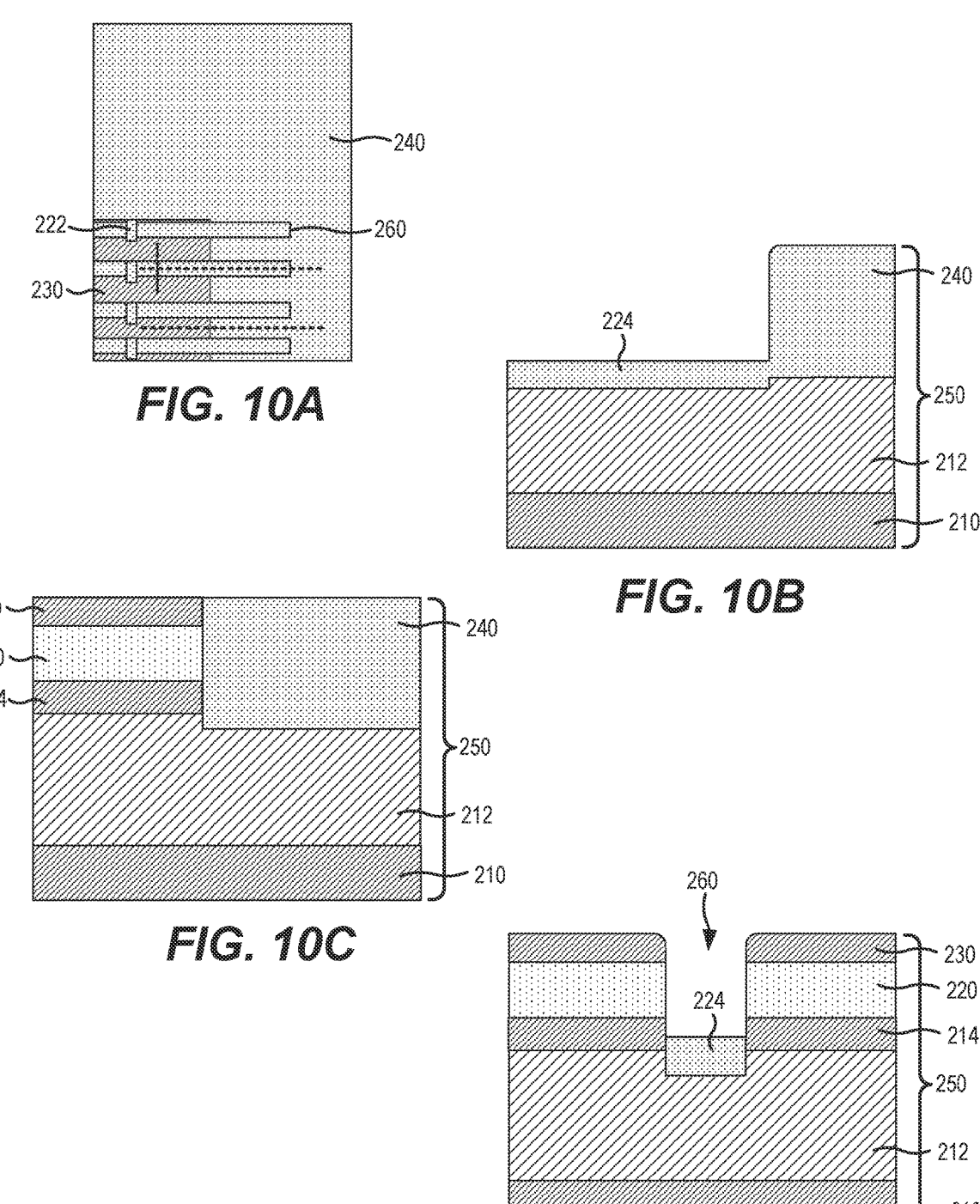
Figures 11A, 11B, 11C, 11D:
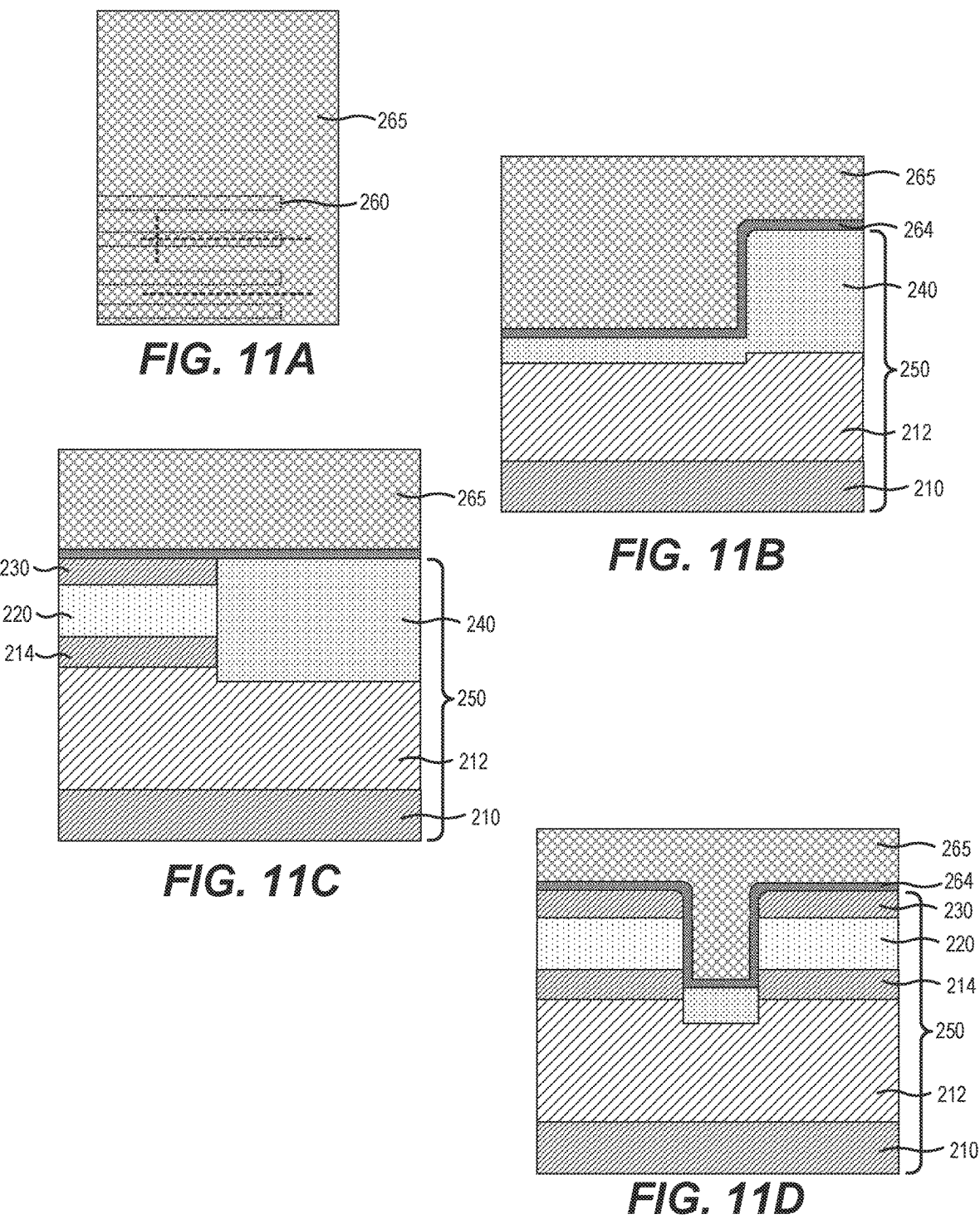
Figures 12A, 12B, 12C, 12D:
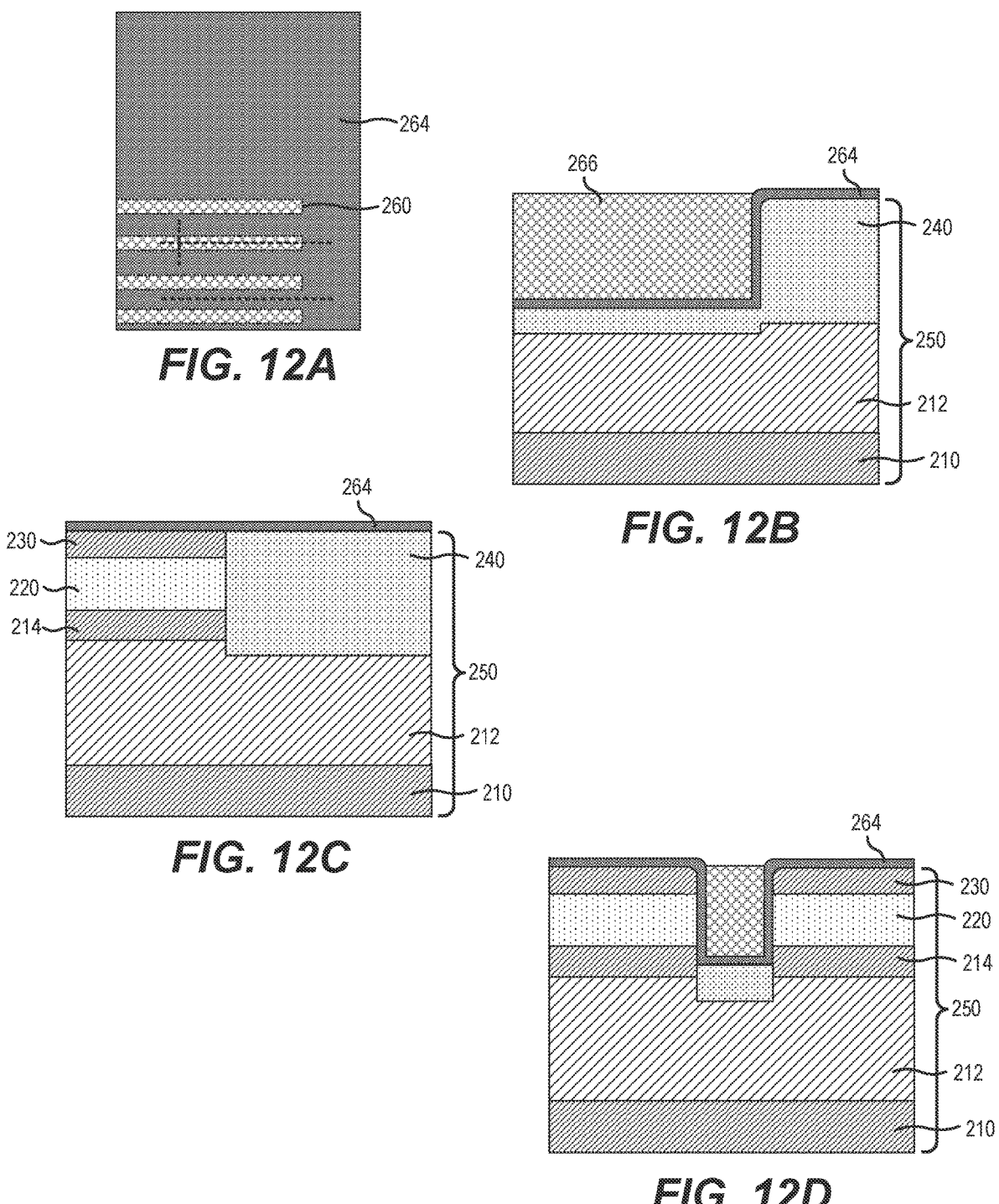
Figures 13A, 13B, 13C, 13D:
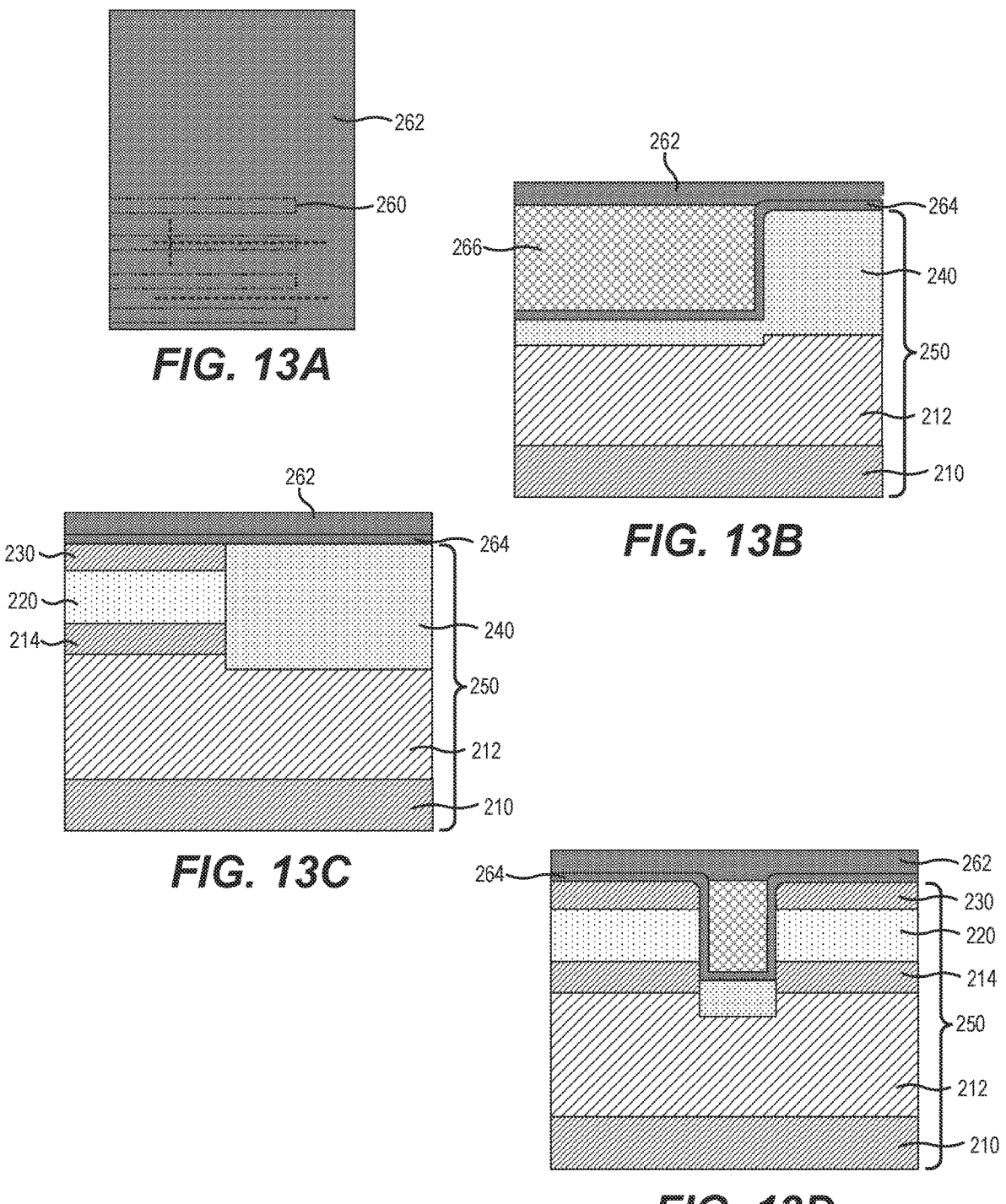

Referring to FIGS. 10A-10D, an annealing step is performed to round the upper edges of the gate trenches 260. Additionally, heavily-doped p-type (p t) deep shielding regions 224 are formed by ion implantation in the semiconductor layer structure 250 underneath the gate trenches 260 and, as shown in FIG. 10A, p-type deep shielding connection patterns 222 may also be formed as part of this ion implantation process at selected locations in the sidewalls of each gate trench 260. The masks that are used in forming the deep shielding regions 224 and the deep shielding connection patterns 222 are not shown in the figures.

As shown, at this stage of the processing the device includes a semiconductor layer structure that comprises a substrate 210, a drift layer 212, a current spreading layer 214, well regions 220, deep shielding connection patterns 222, deep shielding patterns 224, source regions 230 and a heavily-doped p-type layer 240. Trenches 260 are provided in an upper surface of the semiconductor layer structure 250, and the deep shielding regions 224 are formed beneath each gate trench 260.

Referring to FIGS. 11A-11D, a gate dielectric layer 264 is blanket formed in the active region 206 of the device (and extending into portions of the inactive region 208). The gate dielectric layer 264 can include a stable dielectric material with a bandgap approximately 2 eV (or more) larger than the semiconductor material underlying the gate dielectric layer 264. The gate dielectric layer 264 is typically implemented as a silicon oxide (SiO$_2$) layer, although other materials may be used. For example, the gate dielectric layer 264 may alternatively comprise silicon nitride, silicon oxynitride, etc. In some cases, the gate dielectric layer 264 may be a multilayer structure including at least two layers of different dielectric materials.

The gate dielectric layer 264 may be a conformal layer that lines the bottom surfaces, the sidewalls and the end walls of the gate trenches 260. As shown, the gate dielectric layer 264 may also extend onto the upper surface of the semiconductor layer structure 250. In other embodiments, the gate dielectric layer 264 may not extend onto the upper surface of the semiconductor layer structure 250 or some or all of any such portions may be removed. Typically, the thickness of a gate dielectric layer is based on a desired equivalent electrical oxide thickness which optimizes various performance characteristics of the device. For example, when silicon oxide gate dielectric layers are used, typical thicknesses for the gate oxide layer for a silicon carbide based power semiconductor device may be, for example, on the order of 300-1500 nm. An annealing step in a nitrogen/oxygen atmosphere may be performed after the gate dielectric layer 264 is formed to densify the gate dielectric layer 264.

Note that herein references to the "thickness" of a gate dielectric layer (e.g., the gate dielectric layer 264) refers to the extent of the gate dielectric layer in a direction that is perpendicular to the underlying surface on which the gate dielectric layer is formed. Thus, the thickness of gate dielectric layer 264 is measured in the vertical direction for portions of the gate dielectric layer 264 that are on upper surfaces of the semiconductor layer structure 250 and underneath the gate trench 260, while the thickness is measured in the horizontal direction for portions of the gate dielectric layer 264 that are on sidewalls and end walls of the gate trenches 260.

Still referring to FIGS. 11A-11D, a conductive layer 265 is blanket deposited that will be patterned in a later processing step to form the gate fingers 266 of MOSFET 200. The conductive layer 265 may be a doped polysilicon layer in example embodiments. In other embodiments, the conductive layer 265 may comprise a silicide (e.g., NiSi, TiSi, WSi, CoSi), a metal or another stable conductor. Other suitable materials for the gate electrode include various metals such as Ti, Ta or W or metal nitrides such as TiN, TaN or WN. The conductive layer 265 may fill the gate trenches 260 and may further cover the entire semiconductor layer structure 250.

Referring to FIGS. 12A-12D, an etch back process is performed on the conductive layer 265 to remove the conductive layer 265 except for the portions thereof in the gate trenches 260. The conductive layer 265 is a conformal layer that is deposited to have a thickness that is more than twice a width of the gate trenches 260. Consequently, the conductive layer 265 fills the gate trenches 260 (and may have a small longitudinally-extending dip (reduction on thickness, not shown) above the middle of each trench 260. The etch back process may be a reactive ion etch, and may remove the conductive pattern 265 except for the portions thereof that are in the gate trenches 260. This etch back process converts the conductive layer 265 into a plurality of gate fingers 266 that are formed in the respective gate trenches 260. Portions of the gate oxide layer 264 that are outside the gate trenches 260 may or may not be removed during this etch back process, depending upon the selectivity of the etch recipe. The gate oxide layer 264 is shown in the figures as not being removed from the upper surface of the semiconductor layer structure 250 in FIGS. 12A-12D, but it will be appreciated that if a different etch recipe is used, the portions of the gate oxide layer 264 that are outside the gate trenches may instead be removed.

Referring to FIGS. 13A-13D, a supplemental dielectric layer 262 is deposited on the semiconductor layer structure 250. The supplemental dielectric layer 262 may be a single oxide layer or a combination of dielectric layers such as, for example, one or more silicon oxide layers. The supplemental dielectric layer 262 may be a thick layer (e.g., 4000-15,000 angstroms thick). In example embodiments, the supplemental dielectric layer 262 may be between 2-15 times thicker than the gate dielectric layer 264. In other embodiments, the supplemental dielectric layer 262 may be between 4-12 times thicker than the gate dielectric layer 264 or 6-10 times thicker than the gate dielectric layer 264. The supplemental dielectric layer 262 may be a field oxide layer 262 in example embodiments. The supplemental dielectric layer 262 may be formed, for example using a high temperature oxide deposition process. The supplemental dielectric layer 262 may be formed throughout the inactive region 208 of the device or may be blanket formed over the entire device.

Figures 14A, 14B, 14C, 14D:
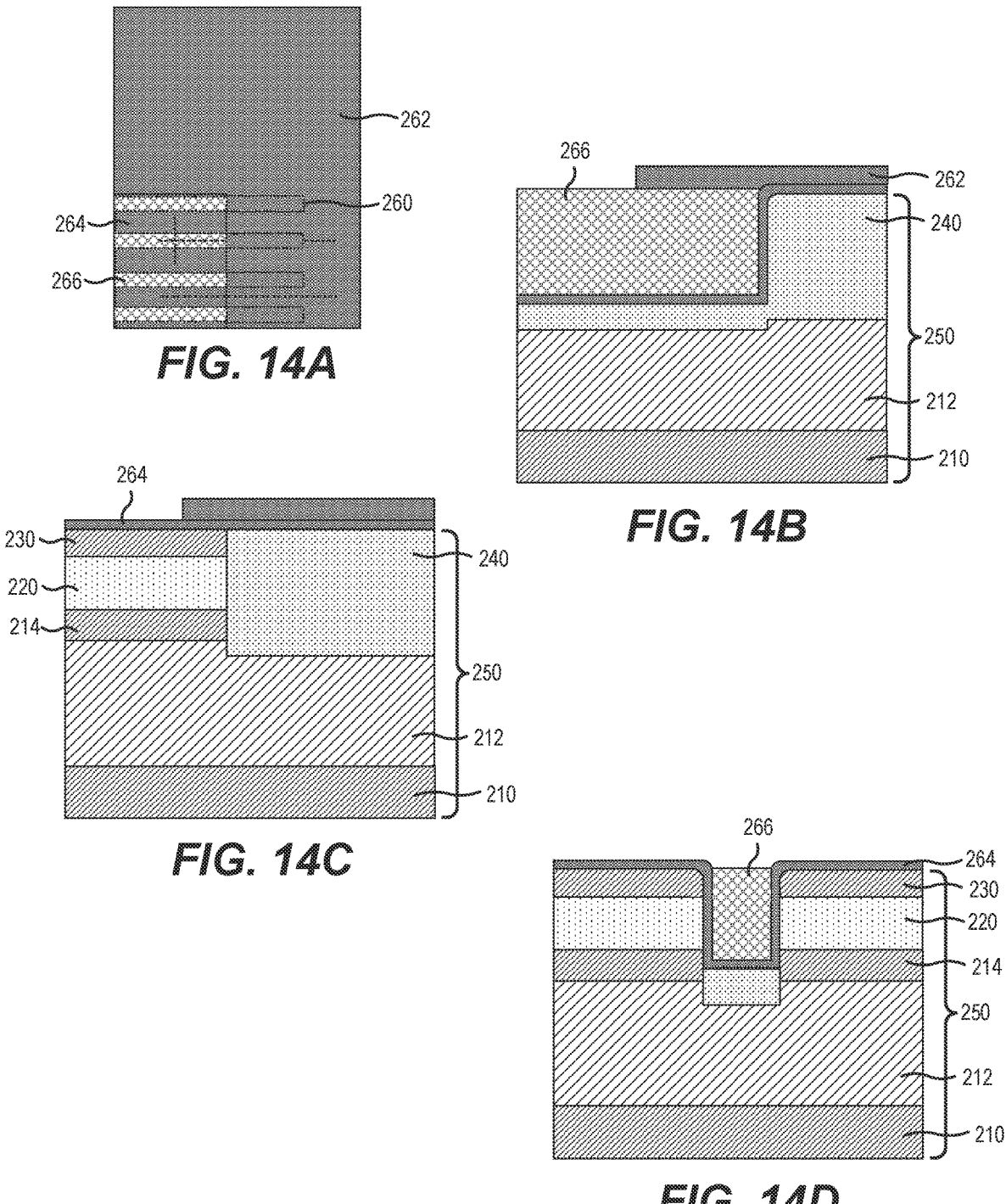
Figures 15A, 15B, 15C, 15D:
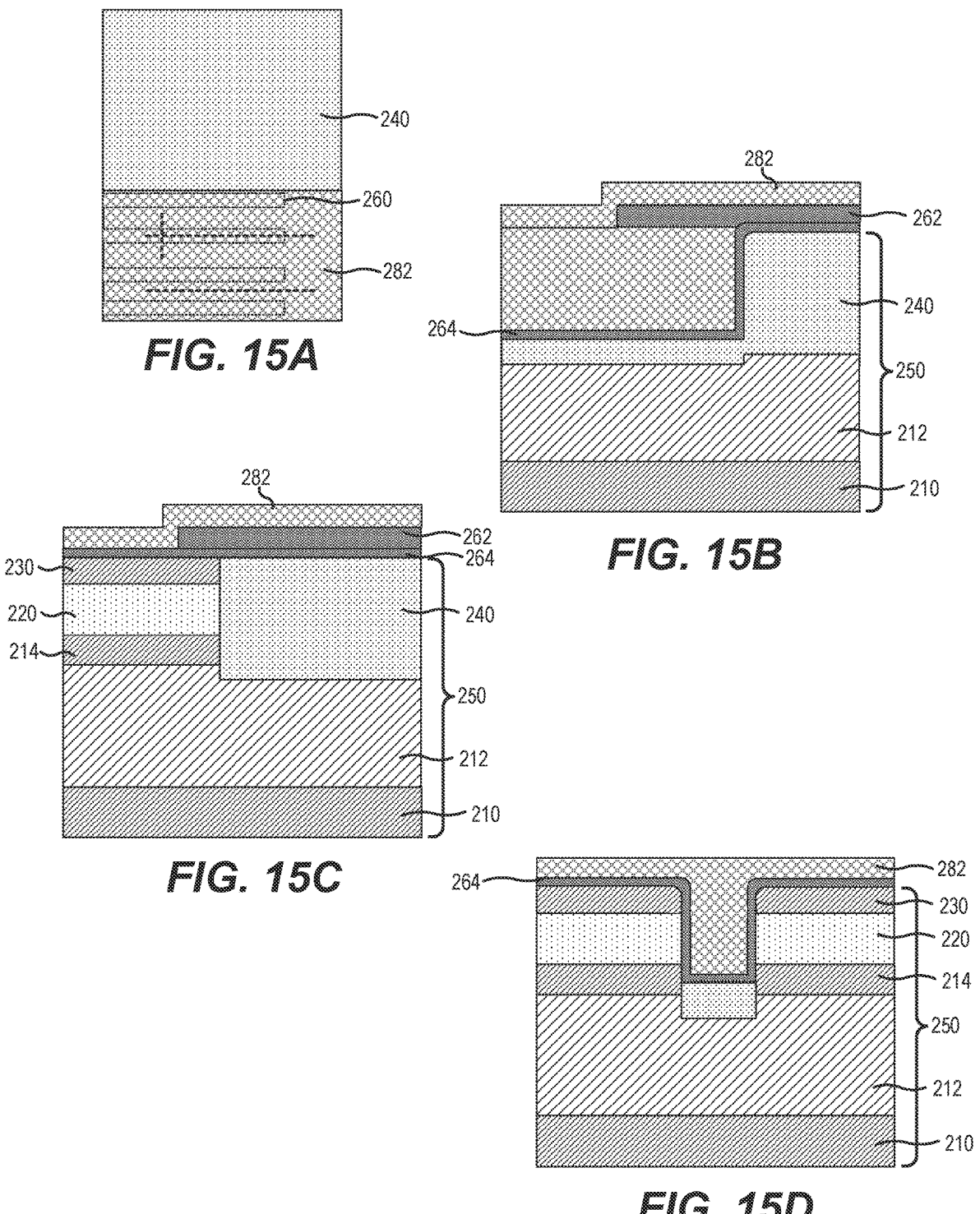
Figures 16A, 16B, 16C, 16D:
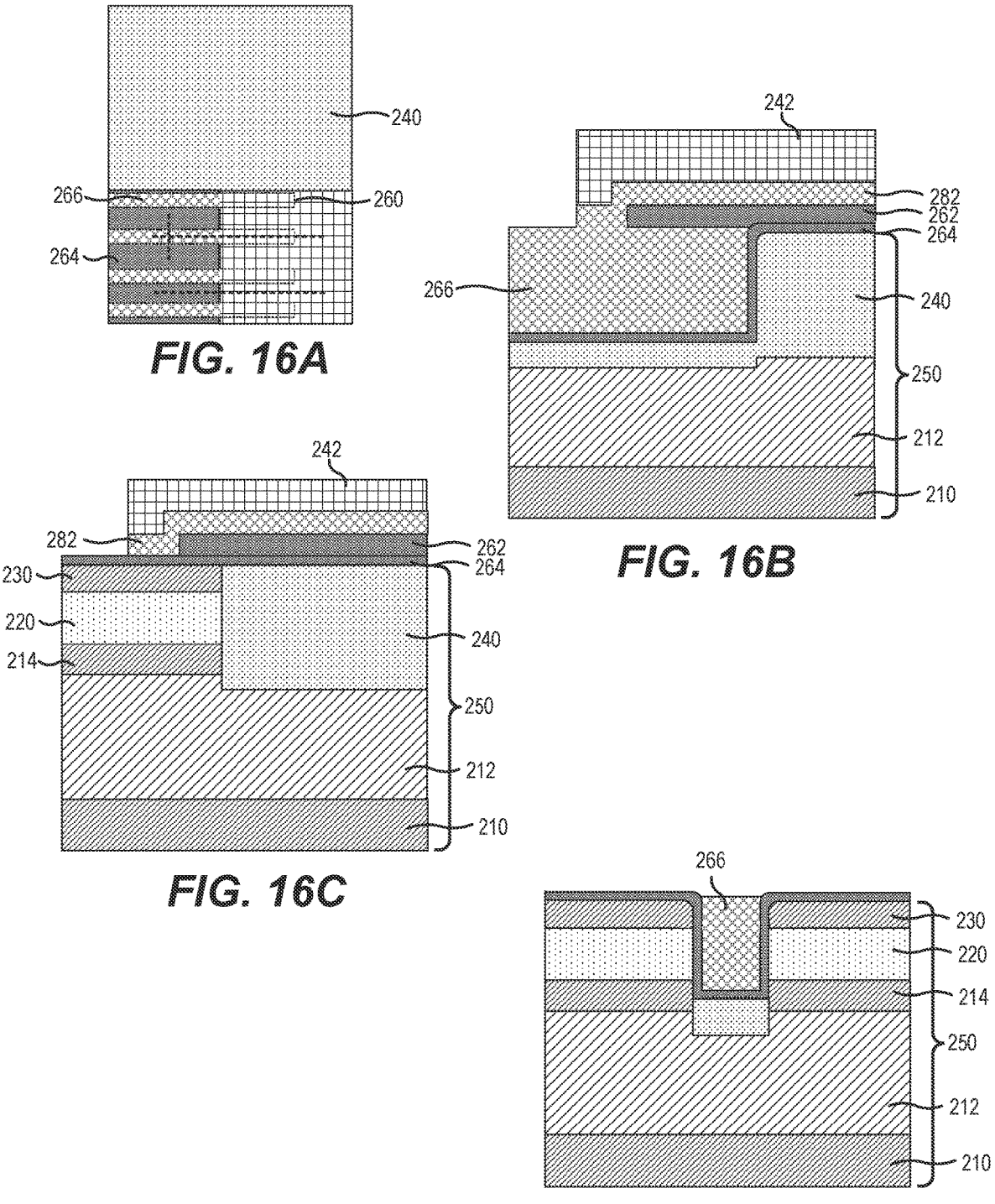
Figures 17A, 17B, 17C, 17D:
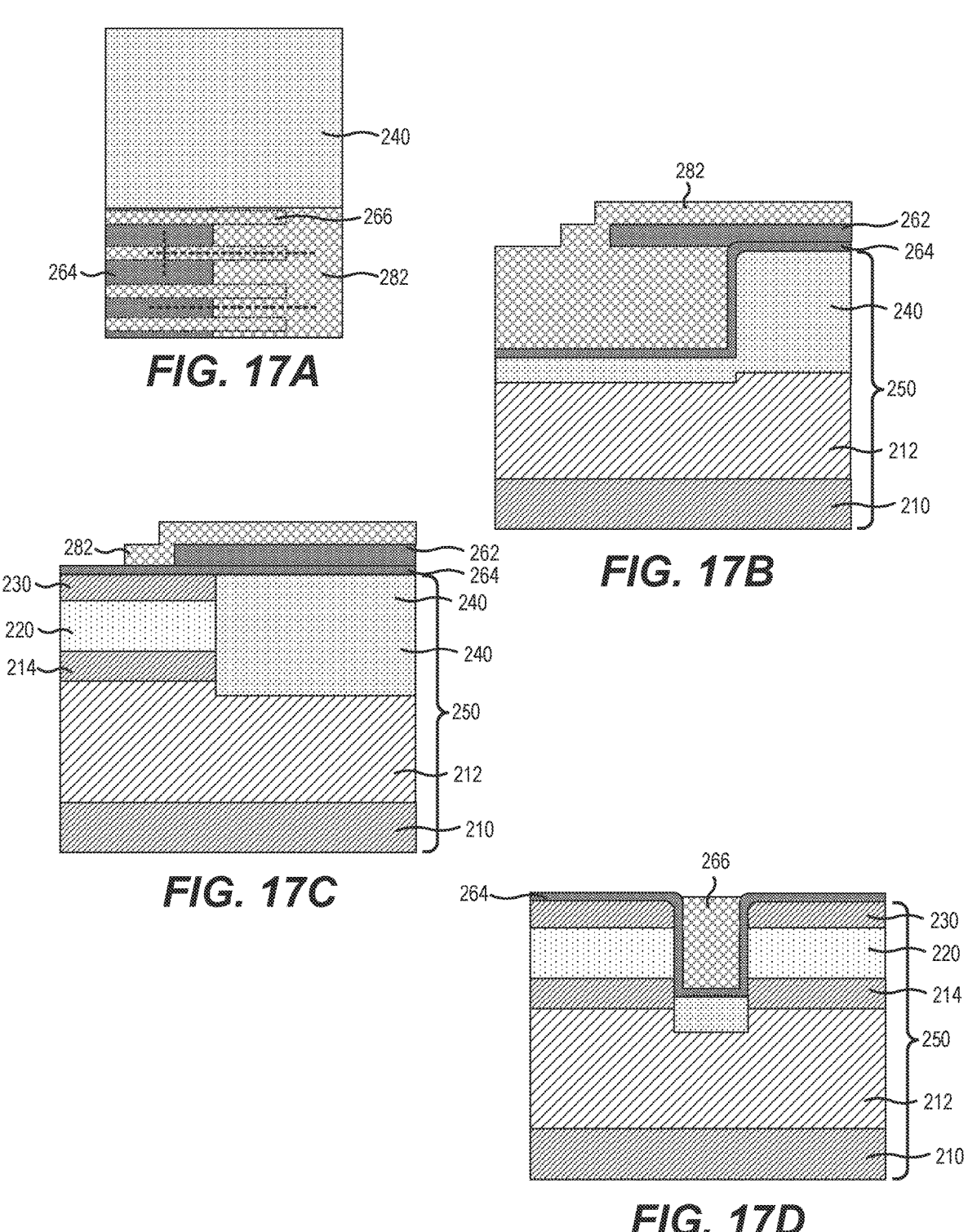
Figures 18A, 18B, 18C, 18D:
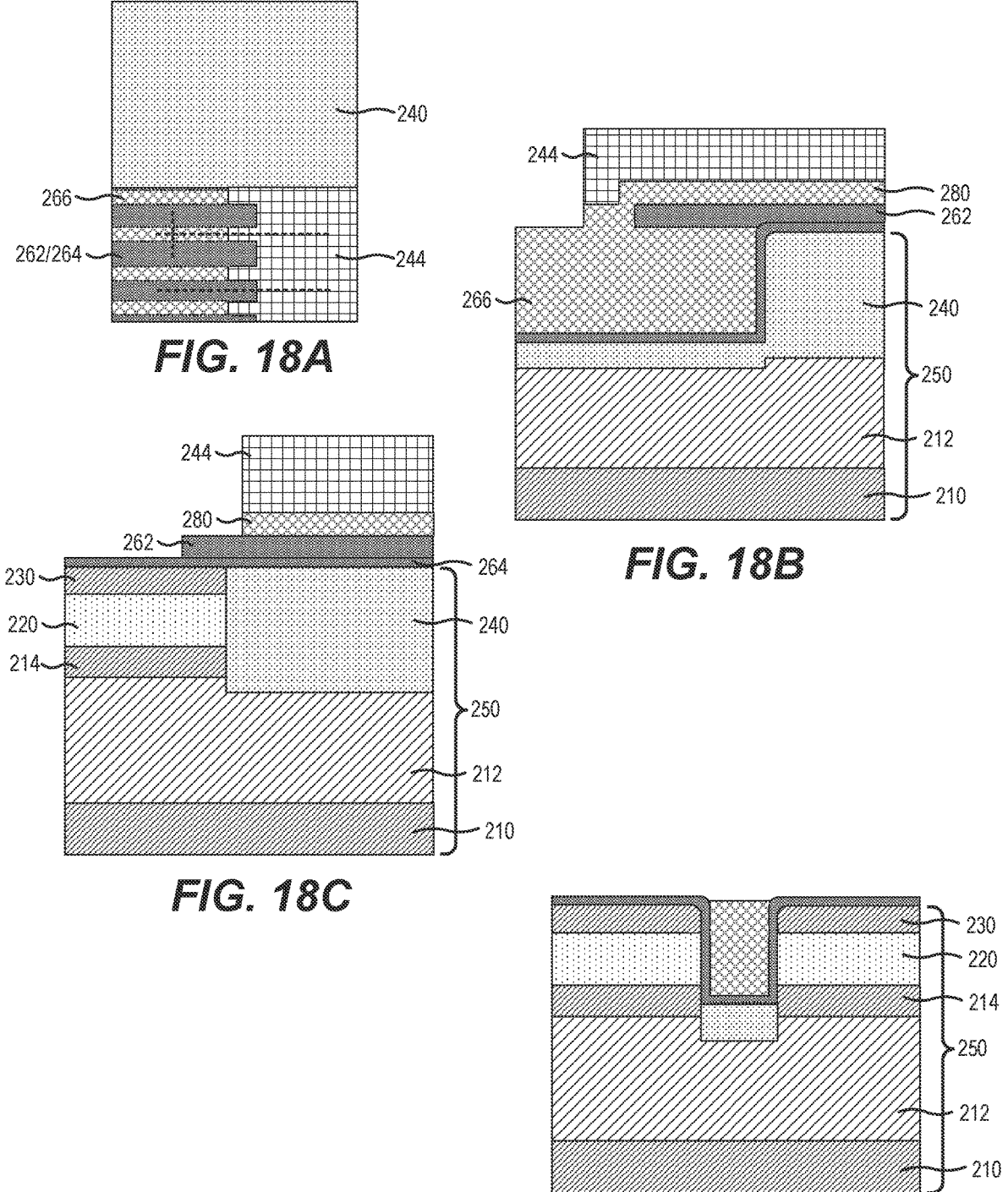

Referring to FIGS. 14A-14D, an etch back process is performed on the supplemental dielectric layer 262. The supplemental dielectric layer 262 is etched so that it mostly does not cover the gate trenches 260, but as shown in FIGS. 14A-14B, the supplemental dielectric layer 262 does cover end portions of the gate trenches 260. In particular, the supplemental dielectric layer 262 extends onto the upper surface of the end of each gate finger 266 and onto the source regions 230 that are adjacent the ends of the gate trenches 260 (FIG. 14C). Thus, the supplemental dielectric layer 262 extends on the gate fingers in the longitudinal direction of the gate fingers 266. Notably, the supplemental dielectric layer 262 increases the thickness of the dielectric material layer that is provided above the end walls if the gate trenches 260. As such, electric fields that are formed in the portions of the gate dielectric layer 264 that extends from the end walls of the trenches 260 onto the upper surface of the p-type region 240 can spread from the gate dielectric layer 264 into the supplemental dielectric layer 262, thereby reducing the value of the electric fields.

Referring to FIGS. 15A-15D, a conductive layer 282 is selectively formed on the supplemental dielectric layer 262 and the gate fingers 266. The conductive layer 282 may comprise, for example, a polysilicon layer in example embodiments, although other semiconductor materials or metals may alternatively or additionally be used.

Referring to FIGS. 16A-16D, a photoresist mask 242 is formed to cover portions of the conductive layer 282. Then, an etch back process is performed to planarize portions of the conductive layer 282 that are exposed by the photoresist mask 242.

Referring to FIGS. 17A-17D, the photoresist mask 242 is removed.

Referring to FIGS. 18A-18D, a photoresist mask 244 is formed to cover portions of the conductive layer 282. Then, another etch back process is performed to further planarize portions of the conductive layer 282 that are exposed by the photoresist mask 244 to convert the conductive layer 282 into one or more gate connectors 280. The gate connectors 280 are used to electrically connects each gate finger 266 to a gate bus that is formed in a later processing step. The gate connectors 280 may comprise a plurality of individual gate connectors that connect respective gate fingers 266 to the (later formed) gate bus or may comprise one or more larger conductive structures that each electrically connect many gate fingers 266 to the gate bus. It should be noted that the processing steps shown in FIGS. 18A-18D may be omitted in some embodiments, as the conductive layer 282 as shown in FIGS. 16A-16D may act as the gate connectors 280.

Figures 19A, 19B, 19C, 19D:
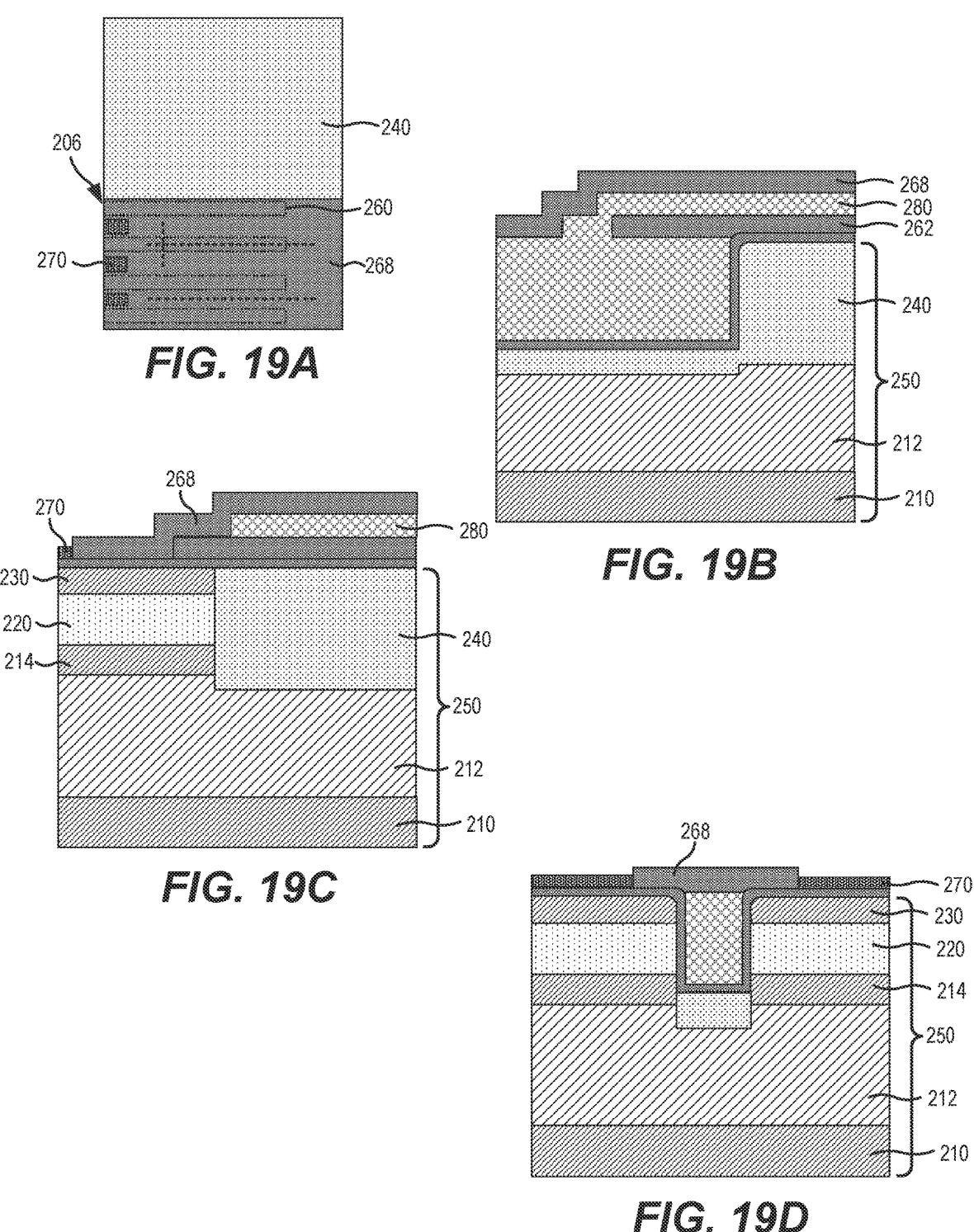
Figures 20A, 20B, 20C, 20D:
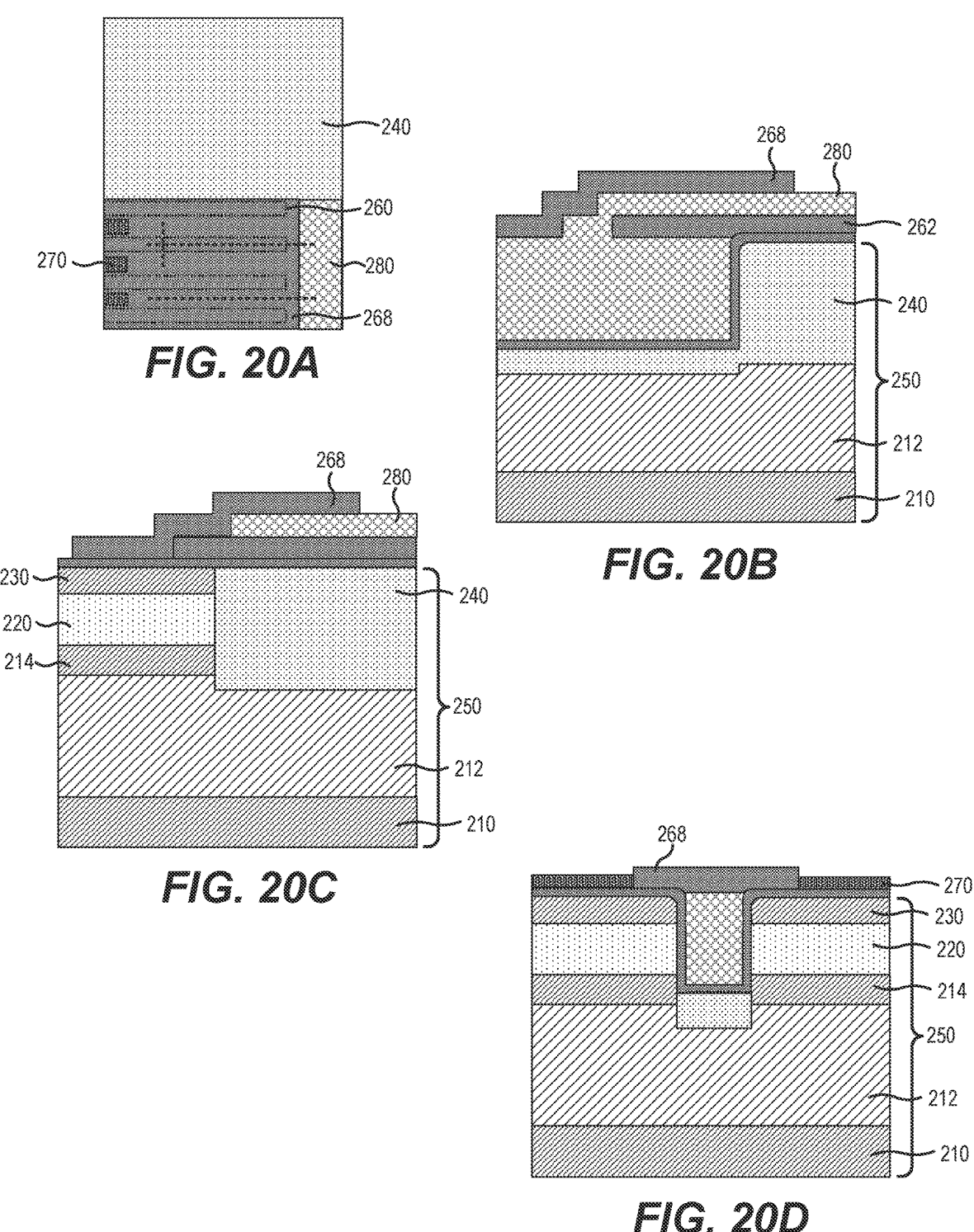

Referring to FIGS. 19A-19D, an intermetal dielectric layer 268 is blanket formed in the active region 206. The intermetal dielectric layer 268 may comprise, for example, a silicon oxide layer, although embodiments of the present invention are not limited thereto. For example, in other embodiments, the intermetal dielectric layer 268 may alternatively or additionally include silicon nitride, silicon oxynitride, aluminum oxide, magnesium oxide or the like. Then, as can be seen in FIGS. 19C-19D, the intermetal dielectric layer 268 is selectively etched to expose the semiconductor layer structure 250 between the gate trenches 260 (e.g., the source regions 220 and the deep shield connection patterns 222). This etching step may convert the portion of the intermetal dielectric layer 268 in the active region 206 into a plurality of elongated gate insulating fingers that cover the upper surfaces of the respective gate fingers 266.

Still referring to FIGS. 19A-19D, ohmic source contact metal 270 is formed on the exposed regions of the semiconductor layer structure 250 in the active region 206. The ohmic source contact metal 270 may be selectively deposited (as shown) or may be blanket deposited so that it extends onto the intermetal dielectric layer 268 and then etched back. The ohmic source contact metal 270 may comprise a metal that forms an ohmic contact with silicon carbide in example embodiments. The ohmic source contact metal 270 may include one or more layers that perform different functions such as, for example, layers that form an ohmic contact, layers that form a diffusion barrier, etc. As shown best in FIGS. 19B-19D, the intermetal dielectric layer 268 covers the gate fingers 266 to prevent the gate fingers 266 from short-circuiting with the source contact metallization 270. The intermetal dielectric layer 268 also electrically isolates the gate connectors 280 from the ohmic source contact metal 270.

Referring to FIGS. 20A-20D, the intermetal dielectric layer 268 is etched in the inactive region 208 to expose end portions of the gate connectors 280.

Referring again to FIGS. 4A-4D (which show the completed device), metal is deposited (either by blanket depositing the metal and then selectively etching the metal or by selectively depositing the metal) that forms all three of a bulk source contact metal layer 272, a gate bus 274 and a gate pad 276. The bulk source contact metal layer 272 is formed in the active region 206 of the MOSFET 200, while the gate bus 274 and the gate pad 276 are formed in the inactive region 208 of MOSFET 200. A metal drain contact (not shown) is formed on the lower surface of the substrate 210 opposite the drift layer 212.

As shown best in FIG. 4B, the supplemental dielectric layer 262 extends onto the ends of the gate fingers 266 that are adjacent the gate bus 274. As such, the supplemental dielectric layer 262 increases the amount of dielectric material that is provided at the upper edge of the ends of each gate trench 260. Thus, when a gate bias voltage is applied so that the MOSFET 200 is in its on-state, the electric fields generated in this region of the gate dielectric layer 264 spread into the supplemental dielectric layer 262, which in turn acts to reduce the magnitude of the electric fields experienced in this corner region of the gate dielectric layer 264. The thicker dielectric material layer in this region of the device also lengthens the time to breakdown as more dielectric material must experience breakdown before the dielectric layer is sufficiently damaged to allow a short circuit between the gate finger 266 and the semiconductor layer structure 250. Thus, the supplemental dielectric layer 262 may significantly extend the expected life of the MOSFET 200 as compared to the expected life of the MOSFET 100 under identical operating conditions.

Thus, as shown in FIGS. 4A-4D, pursuant to embodiments of the present invention, gate trench semiconductor devices are provided that include a semiconductor layer structure 250 that has a gate trench formed 260 in an upper surface thereof. A gate finger 266 is formed in the gate trench 260. A supplemental dielectric layer 262 is formed on an upper surface of the gate finger 266 and may directly contact the gate finger 266 in some embodiments. The supplemental dielectric layer 262 also vertically overlaps the gate trench 260. In some embodiments, the supplemental dielectric layer 262 may be a field oxide layer. In some embodiments, the supplemental dielectric layer 262 may also extend underneath a gate pad 276 and/or one or more gate buses 274 of the gate trench semiconductor device. The supplemental dielectric layer 262 may be significantly thicker than the gate dielectric layer 264 (e.g., two times to ten times as thick). The semiconductor device may further include a gate connector 280 that is on an upper surface of the supplemental dielectric layer 262 and on an upper surface of the gate finger 266.

The semiconductor device may further include a gate dielectric layer 264 in the gate trench 260 between the semiconductor layer structure 250 and the gate finger 266. The supplemental dielectric layer 262 may directly contact a portion of the gate dielectric layer 264 that at least partially covers an upper corner of the gate trench 260. The gate trench 260 extends longitudinally in the semiconductor layer structure 250 and has a longitudinally-extending lower surface, opposed, longitudinally-extending opposed first and second side walls, and opposed first and second end walls. The gate dielectric layer 264 has a first portion that extends upwardly along the first end wall of the gate trench. The supplemental dielectric layer 262 may directly contact this first portion of the gate dielectric layer 264.

The semiconductor device may further comprise an intermetal dielectric layer 268 that is on an upper surface of the gate connector 280, a source contact 270/272 that is on an upper surface of the intermetal dielectric layer 268, and a gate bus 274 that is on an upper surface of the supplemental dielectric layer 262. The intermetal dielectric layer 268 may vertically overlap the supplemental dielectric layer 262. The gate connector 280 may electrically connect the gate bus 274 to the gate finger 266, and the gate connector 280 may be in between the supplemental dielectric layer 262 and the intermetal dielectric layer 268.

In some embodiments, the supplemental dielectric layer 262 may extend on an upper surface of a portion of the semiconductor layer structure 250 that is in an inactive area 208 of the semiconductor device that is adjacent an end of the gate trench 260.

Pursuant to further embodiments of the present invention, gate trench semiconductor devices are provided that comprise a semiconductor layer structure 250 that has a gate trench 260 therein, with a gate finger 266 and a gate dielectric layer 264 disposed in the gate trench 260. A supplemental dielectric layer 262 is formed on an upper surface of the gate dielectric layer 264 and on an upper surface of the gate finger 266. An intermetal dielectric layer 268 vertically overlaps the supplemental dielectric layer 262 and/or vertically overlaps the gate trench 260.

Pursuant to still further embodiments of the present invention, gate trench semiconductor devices are provided that comprise a semiconductor layer structure 250 that has a gate trench 260 therein, with a gate finger 266 in the gate trench 260. These semiconductor devices further comprise a gate bus 274 and a gate connector 280 that electrically connects the gate finger to the gate bus 274. A supplemental dielectric layer 262 is interposed in between an end portion of the gate finger 266 and the gate connector 280. The gate connector 280 may directly contact both the gate finger 266 and the supplemental dielectric layer 262 in some embodiments.

Pursuant to yet additional embodiments of the present invention, gate trench semiconductor devices are provided that comprise a semiconductor layer structure 250. A gate trench 260 extends longitudinally in an upper surface of the semiconductor layer structure 250, the gate trench 260 having a longitudinally-extending lower surface, opposed, longitudinally-extending first and second side walls, and opposed first and second end walls. A gate dielectric layer 264 is provided on the lower surface, first and second side walls and first and second end walls of the gate trench 260. A gate finger 266 is formed in the gate trench 266, and a supplemental dielectric layer 262 vertically overlaps the gate trench 260 and directly contacts a portion of the gate dielectric layer 264 that is on the first end wall of the gate trench 260. The supplemental dielectric layer 262 may also directly contact an upper surface of the gate finger 266.

Figures 21, 22A, 22B:
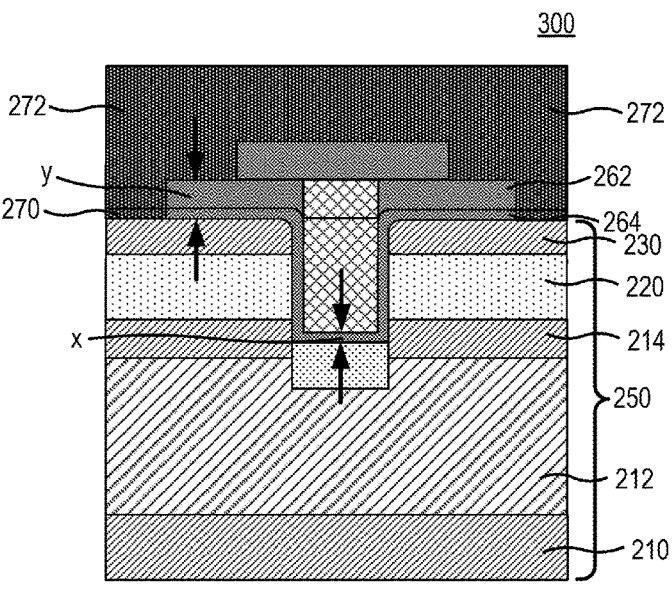
FIG. 21 is a schematic cross-sectional view of a modified version of the silicon carbide MOSFET of FIGS. 4A-4D.
FIGS. 22A and 22B are schematic cross-sectional views of another modified version of the silicon carbide MOSFET of FIGS. 4A-4D.

Pursuant to further embodiments of the present invention, the above fabrication process may be modified to allow portions of the supplemental dielectric layer 262 to extend throughout the active area between the gate trenches 260. FIG. 21 is a cross-sectional view taken across one of the gate trenches of a MOSFET 300 that includes such a design.

As shown in FIG. 21, the supplemental dielectric layer 262 is formed in the active area of the device so that it extends on the semiconductor layer structure 250 on either side of each gate trench 260. The supplemental dielectric layer 262 extends slightly into the gate trenches 260 so that it vertically overlaps the gate dielectric layer 264 that extends on the sidewalls of the gate trench 260. As a result, the supplemental dielectric layer 262 acts to increase the thickness of the sidewalls of the gate dielectric layer 264, which will allow the electric fields in the portions of the gate dielectric layer 264 that extend along the upper sidewalls of the gate trenches 260 to spread out into the supplemental dielectric layer 262, thereby lowering the electric field levels in the gate dielectric layer 264.

As shown in FIG. 21, the MOSFET 300 may be viewed as having a first dielectric layer that lines the bottom surface and sidewalls of the gate trench 260. Here, this first dielectric layer has a thickness of "x" and corresponds to the gate dielectric layer 264. A second dielectric layer extends on the upper surface of the semiconductor layer structure 250 adjacent each side of each gate trench 260. This second dielectric layer has a thickness of "y" and may correspond to the combination of the gate dielectric layer 264 and the supplemental dielectric layer 262. The thickness "y" may be greater than the thickness x, which improves the dielectric breakdown performance of the device. In some embodiments, the thickness y may be at least twice, at least three times, at least four times, at least six times, at least eight times or at least ten times the thickness "x." While in the depicted embodiment, the second dielectric layer corresponds to the combination of the gate dielectric layer 264 and the supplemental dielectric layer 262, it will be appreciated that in other embodiments, the gate dielectric layer 264 may be removed from the upper surface of the semiconductor layer structure so that the second dielectric layer corresponds to only the supplemental dielectric layer 262. In other words, in some embodiments the gate dielectric layer 264 may not extend onto the upper surface of the semiconductor layer structure 250 underneath the supplemental dielectric layer 262, and in such embodiments the supplemental dielectric layer 262 may rest directly on the semiconductor layer structure 250. This will still act to improve the breakdown performance of the device as the supplemental dielectric layer 262 may be significantly thicker than the gate dielectric layer 264.

As the above discussion makes clear, FIG. 21 schematically illustrates a semiconductor device 300 that has a semiconductor layer structure 250 having a gate trench 260 therein. A first dielectric layer is formed on sidewalls and a bottom surface of the gate trench 260. Here, the first dielectric layer corresponds to the portion of the gate dielectric layer 264 that is in the gate trench 260. A gate finger 266 is formed in the gate trench 260 on the first dielectric layer 264. A second dielectric layer is provided on the upper surface of the semiconductor layer structure 250, and this second dielectric layer directly contacts the upper surface of the first dielectric layer 264. Here, the second dielectric layer corresponds to the combination of the supplemental dielectric layer 262 and a portion of the gate dielectric layer 264 that is on the upper surface of the semiconductor layer structure 250 adjacent the gate trench 260. As shown in FIG. 21, the second dielectric layer 262/264 is thicker than the first dielectric layer 264. While in the depicted embodiment, the second dielectric layer corresponds to the combination of the supplemental dielectric layer 262 and the portion of the gate dielectric layer 264 that is on the upper surface of the semiconductor layer structure 250 adjacent the gate trench 260, it will be appreciated that in other embodiments the gate dielectric layer 264 may not be formed on the upper surface of the semiconductor layer structure 250 or may removed therefrom before the supplemental dielectric layer 262 is formed. In such embodiments, the second dielectric layer may correspond to just the supplemental dielectric layer 262. As noted above, the supplemental dielectric layer 262 may be 2-15 times as thick as the gate dielectric layer 264, so the provision of the much thicker supplemental dielectric layer 262 extending over the portions of the gate dielectric layer 264 that coat the sidewalls of the gate trench may significantly improve the on-state breakdown performance of MOSFET 300 as compared to conventional gate trench power semiconductor devices.

FIGS. 22A and 22B illustrate a MOSFET 400 according to further embodiments of the present invention. MOSFET 400 is a modified version of MOSFET 300. FIG. 22A is a cross-sectional view of MOSFET 400 taken along line B-B of FIG. 4A. FIG. 22B is a cross-sectional view of MOSFET 400 taken along line E-E of FIG. 4A.

As shown in FIG. 22A, MOSFET 400 differs from MOSFET 300 in that the supplemental dielectric layer 262 extends inwardly over the gate trench 260 past the gate dielectric layer 264 so that the supplemental dielectric layer 262 vertically overlaps both the gate dielectric layer 264 in the gate trench 260 and also vertically overlaps the gate finger 266. In other words, the supplemental dielectric layer 262 extends longitudinally adjacent each side of each gate trench 260 and also extends laterally to partially cover each gate trench 260. As a result, the supplemental dielectric layer 262 acts to further increase the amount of dielectric material present along the upper corners of the gate dielectric layer 264 that extend along the length of the gate trench 260. This allows the electric fields in the portions of the gate dielectric layer 264 that extend along the upper sidewalls of the gate trenches 260 to spread out into the supplemental dielectric layer 262, thereby lowering the electric field levels in the gate dielectric layer 264.

As is further shown in FIG. 22A, the MOSFET 400 may be viewed as having a first dielectric layer that lines the bottom surface and sidewalls of the gate trench 260. Here, this first dielectric layer has a thickness of "x" and corresponds to the gate dielectric layer 264. A second dielectric layer extends on the upper surface of the semiconductor layer structure 250 adjacent each side of each gate trench 260. This second dielectric layer has a thickness of "y" and may correspond to the combination of the gate dielectric layer 264 and the supplemental dielectric layer 262. The thickness "y" may be greater than the thickness x, which improves the dielectric breakdown performance of the device. In some embodiments, the thickness y may be at least twice, at least three times, at least four times, at least six times, at least eight times or at least ten times the thickness "x." Moreover, the second dielectric layer may extend inwardly from the plane defined by the sidewall of the gate trench 260 by a distance t, whereas the first dielectric layer only extends inwardly from the plane defined by the sidewall of the gate trench 260 by the distance x. In some embodiments, the distance t may be at least twice, at least three times, at least four times, at least six times, at least eight times or at least ten times the thickness "y."

FIG. 22A is a cross-sectional view through a gate trench 260 in the active area of MOSFET 400. FIG. 22B, in contrast, is a cross-sectional view through the gate trench 260 in the inactive area of MOSFET 400. As can be seen by comparing FIGS. 22A and 22B, the primary difference is that in the inactive region of MOSFET 400, the supplemental dielectric layer 262 extends laterally across the gate finger 266 to cover the entire top surface of the end portion of the gate finger, whereas in the active region of MOSFET 400 the supplemental dielectric layer 262 only covers a portion of each side of the gate finger 266. This allows a conductive layer (which may be the gate connector 280 to contact the upper surface of the gate finger 266 to feed gate signals to the gate finger 266.

As the above discussion makes clear, FIGS. 22A-22B schematically illustrates a semiconductor device 400 that has a semiconductor layer structure 250 having a gate trench 260 therein. A first dielectric layer is formed on sidewalls and a bottom surface of the gate trench 260. Here, the first dielectric layer corresponds to the portion of the gate dielectric layer 264 that is in the gate trench 260. A gate finger 266 is formed in the gate trench 260 on the first dielectric layer 264. A second dielectric layer is provided on the upper surface of the semiconductor layer structure 250, and this second dielectric layer directly contacts and vertically overlaps the gate finger 266. In other words, the second dielectric layer extends (on each side of the gate trench 260) from the upper surface of the semiconductor layer structure 250 over the gate trench 260 and extends sufficiently far over the gate trench 260 to be above the gate finger 266, and may directly contact the gate finger 266. Here, the second dielectric layer corresponds to the combination of the supplemental dielectric layer 262 and a portion of the gate dielectric layer 264 that is on the upper surface of the semiconductor layer structure 250 adjacent the gate trench 260, although in other embodiments the second dielectric layer may be implemented as only the supplemental dielectric layer 262 in the same manner discussed above with reference to MOSFET 300 of FIG. 21. The second dielectric layer may be significantly thicker than the first dielectric layer (e.g., 2-15 times as thick).

The MOSFETs 300 and 400 that include a supplemental dielectric layer 262 that provides enhanced protection to the portion of the gate dielectric layer 264 on the upper sidewalls of the gate trenches 260 may be formed in various ways. In a first approach, the conductive layer 265 (FIGS. 11A-11D) can be planarized as shown in FIGS. 12A-12D to form the gate fingers 266, and the supplemental dielectric layer 262 may then be blanket formed on the device as shown in FIGS. 13A-13D. Then, the supplemental dielectric layer 262 may be etched in a manner similar to that shown in FIGS. 14A-14D, except that small stripes of the supplemental dielectric layer 262 are allowed to remain on each side of each gate trench (with the supplemental dielectric layer 262 in the remainder of the regions between adjacent gate trenches removed so that the source contact metallization 270/272 may contact the semiconductor layer structure 250).

In a second approach, the conductive layer 265 as shown in FIGS. 11A-11D) can be partially planarized, but not as much as shown in FIGS. 12A-12D. Then an oxidation process may be performed that oxidizes the upper portions of the (polysilicon) conductive layer 265 to form a supplemental dielectric layer 262 in the active region of the device over the gate fingers 266. The supplemental dielectric layer 262 will also extend outwardly beyond the sidewalls of the gate trenches 260 as shown in FIGS. 21 and 22A-22D. Thus, it will be appreciated that the MOSFETS 300 and 400 may be fabricated in a variety of different ways.

Figure 23A:
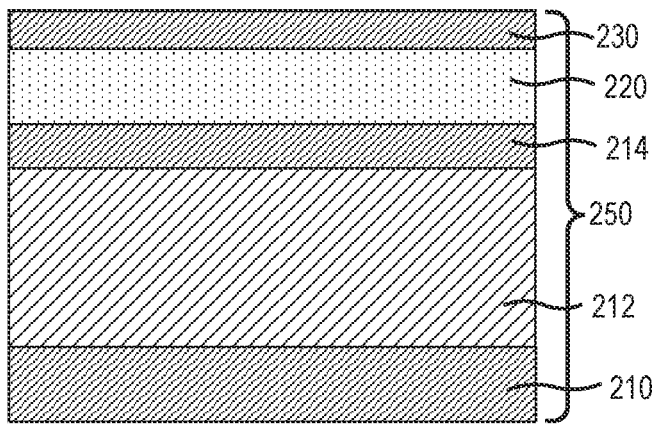
FIGS. 23A-23D are schematic cross-sectional views illustrating an alternative method of fabricating silicon carbide semiconductor devices according to embodiments of the present invention.
Figure 23B:
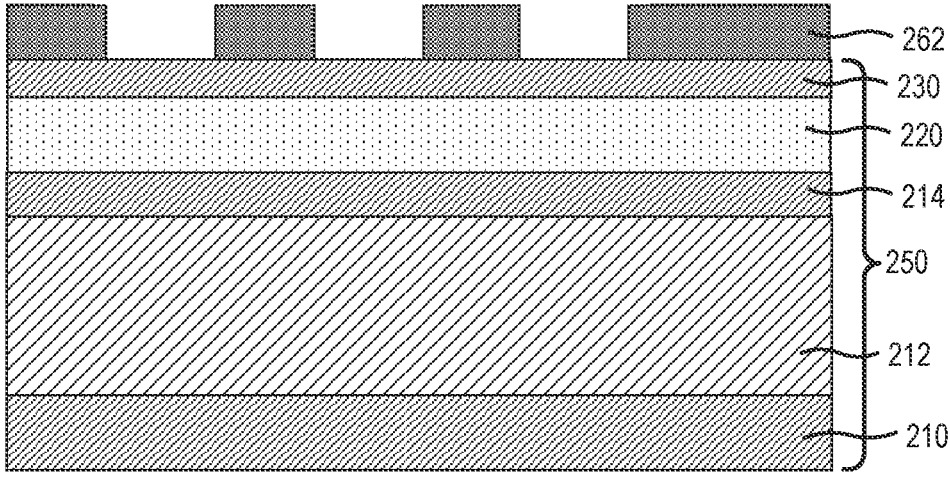

In still other embodiments of the present invention, the supplemental dielectric layer 262 may be formed before the gate trenches 260 are formed by etching the upper surface of the semiconductor layer structure 250. In these embodiments, the device illustrated in FIGS. 8A-8D may first be formed. FIGS. 23A-23D then illustrate how the gate trenches can be formed. Referring to FIGS. 23A-23D, FIG. 23A replicates FIG. 8D, but adds 100 to all reference numerals from FIG. 8D. Referring to FIG. 23B, the supplemental dielectric layer 262 is blanket formed on the device. The supplemental dielectric layer 262 is then etched. In the active region of the device, the supplemental dielectric layer 262 may be etched as shown in FIG. 23B, which is a cross-section taken along the same line as FIG. 23A (FIG.

8D), but the cross-section of FIG. 23B is a longer cross-section that extends across the regions where several gate trenches 260 will be formed.

Figure 23C:
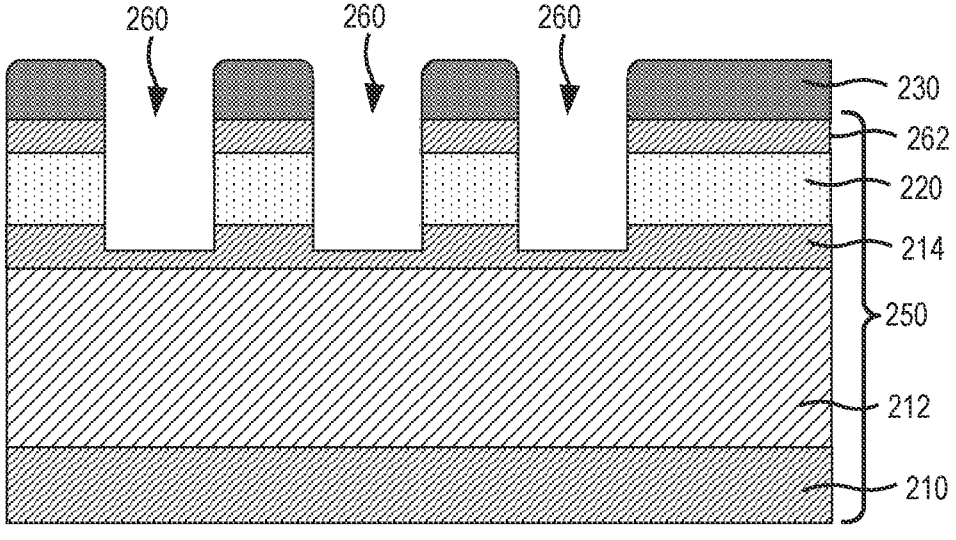

Referring to FIG. 23C, a trench etch may be performed using the supplemental dielectric layer 262 as a mask to form the gate trenches 260.

Figure 23D:
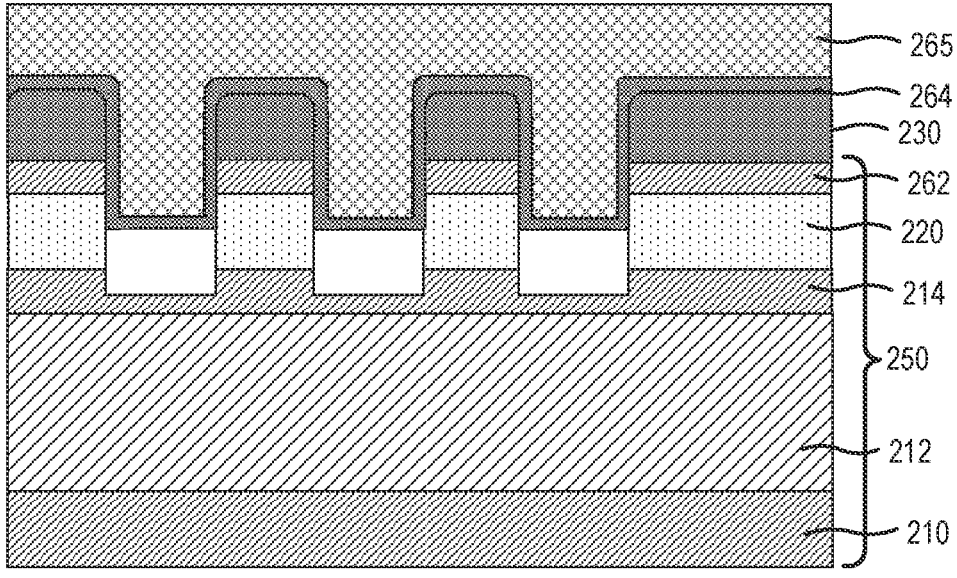

Referring to FIG. 23D, a conductive layer 265 (e.g., a doped polysilicon layer) may be formed that fills the gate trenches 260 and also extends across the upper surface of the semiconductor layer structure 250. Thereafter, appropriate etching of the conductive layer 265 and the supplemental dielectric layer 262 may be performed to fabricate the MOSFET 200 (or the MOSFETS 300, 400).

While the figures above focus on regions of the depicted MOSFETs 200, 300, 400 where the gate fingers are fed via a gate bus, it will be appreciated that some gate fingers may be fed directly from a gate pad instead of from a gate bus. In such embodiments, the gate connectors may extend between the gate pad and the gate fingers, and the supplemental dielectric layers according to embodiments of the present invention may still vertically overlap the gate trenches and the corresponding gate fingers that connect directly to the gate pad.

Figure 24:
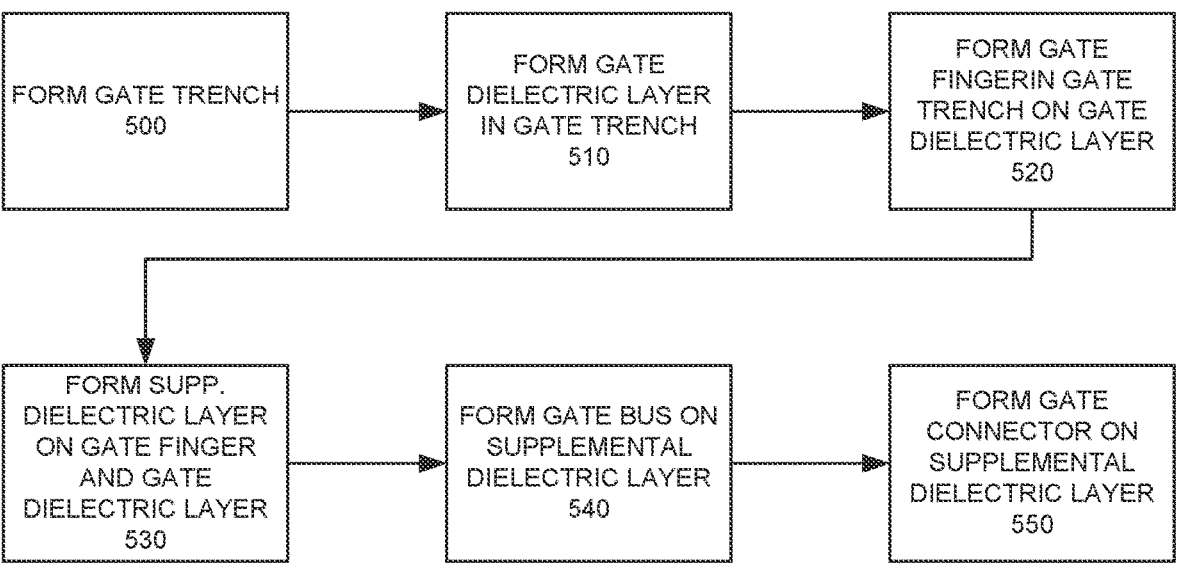
FIG. 24 is a flow chart illustrating a method according to embodiments of the present invention for fabricating gate trench semiconductor devices.

FIG. 24 is a flow chart illustrating a method of fabricating a gate trench semiconductor device according to embodiments of the present invention. As shown in FIG. 24, operations may begin with a gate trench being formed in a semiconductor layer structure (Block 500). The semiconductor layer structure may comprise, for example, a silicon carbide semiconductor layer structure. Next, a gate dielectric layer is formed in the trench (Block 510). The gate dielectric layer may comprise, for example, a thin, high quality silicon oxide layer in example embodiments. Next, a gate finger is formed in the gate trench on the gate dielectric layer so that the gate dielectric layer is in between the semiconductor layer structure and the gate finger (Block 520). The gate finger may comprise doped polysilicon in example embodiments.

Next, a supplemental dielectric layer is formed on both the gate finger and on the gate dielectric layer (Block 530). The supplemental dielectric layer may be formed on a portion of the gate finger that is in the gate trench and may vertically overlap the gate trench. In some embodiments, the supplemental dielectric layer may be interposed between the gate connector and the gate finger. In some cases, the supplemental dielectric layer directly contact both the gate connector and the gate finger. A gate bus and/or the gate pad may then be formed on the supplemental dielectric layer (Block 540). The method may also comprise forming a gate connector on the supplemental dielectric layer (Block 550). The gate connector may extend between the gate bus and the gate finger and may electrically connect the gate finger to the gate bus.

In some embodiments, the supplemental dielectric layer may only extend over an end portion of the gate trench, and thus may extend over the gate trench for less than half a length of the gate trench or for less than a quarter of the length of the gate trench. In such embodiments, the supplemental dielectric layer may be designed primarily to protect a portion of the gate dielectric layer that extends over an upper end wall of the gate trench. In other embodiments, the supplemental dielectric layer may extend substantially the full length of the gate trench and may vertically overlap the gate trench along substantially the full length of the gate trench. In these embodiments, the supplemental dielectric layer may be designed to protect portions of the gate dielectric layer that extend over both the upper sidewalls and the upper end wall of the gate trench. In some cases, the supplemental dielectric layer may extend substantially the full length of the gate trench and may extend inwardly over the gate trench to vertically overlap the gate finger along substantially the full length of the gate trench.

While the above description uses a MOSFET 200 as an example, it will be appreciated that the techniques described herein may be utilized in any gate trench semiconductor devices that use a metal-oxide and/or metal-insulator interface, such as MISFETs, IGBT devices and gate-controlled thyristors, to name a few. Thus, it will be understood that the same fabrication techniques may be used to form other devices that have supplemental dielectric layers that protect the upper corners of the gate oxide layers that extend from the gate trenches without deviating from the embodiments described herein. It will also be appreciated that the above description is of an n-type MOSFET. In p-type devices, the locations of the source and drain contacts may be reversed, and the conductivity types of the other n- and p-type regions may be swapped. All of the embodiments disclosed herein may be implemented either as n-type or as p-type devices.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on," "connected to," or "coupled to" another element or layer, it can be directly on, connected or coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above"

the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, elements, and/or components, but do not preclude the presence or addition of one or more other features, elements, components, and/or groups thereof.

Herein, "substantially" means within 10%.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device, comprising:
a semiconductor layer structure comprising a gate trench formed in an upper surface thereof;
a gate finger in the gate trench;
a supplemental dielectric layer on an upper surface of the gate finger, the supplemental dielectric layer vertically overlapping the gate trench;
a gate connector that includes a first portion that is on an upper surface of a portion of the supplemental dielectric layer that extends beyond a first end of the gate trench and a second portion that is on an upper surface of the gate finger, the gate connector comprising a semiconductor material;

a metal gate bus, wherein the gate connector is positioned in between the semiconductor layer structure and the metal gate bus;

an intermetal dielectric layer that is on an upper surface of the first portion of the gate connector; and a source contact on an upper surface of the intermetal dielectric layer.

2. The semiconductor device of claim 1, further comprising a gate dielectric layer in the gate trench between the semiconductor layer structure and the gate finger.

3. The semiconductor device of claim 1, wherein the supplemental dielectric layer directly contacts a portion of the gate dielectric layer that at least partially covers an upper corner of the gate trench.

4. The semiconductor device of claim 1, wherein the gate finger extends longitudinally in the gate trench and has a longitudinally-extending upper surface, a longitudinally-extending lower surface, opposed, longitudinally-extending first and second side walls, and opposed first and second end walls, and wherein the supplemental dielectric layer extends over the first end wall of the gate finger.

5. The semiconductor device of claim 1, wherein the intermetal dielectric layer vertically overlaps the supplemental dielectric layer.

6. The semiconductor device of claim 1, wherein the supplemental dielectric layer vertically overlaps the gate finger along substantially the entire length of the gate finger.

7. The semiconductor device of claim 6, wherein the supplemental dielectric layer directly contacts the gate finger along substantially the entire length of the gate finger.

8. The semiconductor device of claim 1, wherein the supplemental dielectric layer extends laterally across a full width of the gate finger in at least a portion of an inactive region of the semiconductor device, and the supplemental dielectric layer extends laterally across less than the full width of the gate finger in at least a portion of an active region of the semiconductor device.

9. The semiconductor device of claim 1, wherein the gate dielectric layer extends in between a lower surface of the supplemental dielectric layer and the upper surface of the semiconductor layer structure in the region of the semiconductor layer structure that is beyond the first end of the gate trench.

10. A semiconductor device, comprising:

a semiconductor layer structure comprising a gate trench therein that has a rounded upper corner;

a gate finger in the gate trench;

a gate dielectric layer in the gate trench between the semiconductor layer structure and the gate finger;

a supplemental dielectric layer on an upper surface of the gate dielectric layer and on an upper surface of the gate finger, the supplemental dielectric layer extending above the gate trench and beyond a first end of the gate trench; and an intermetal dielectric layer that vertically overlaps the supplemental dielectric layer and the gate trench, the intermetal dielectric layer extending beyond the first end of the gate trench above the supplemental dielectric layer.

11. The semiconductor device of claim 10, wherein the supplemental dielectric layer directly contacts a portion of the gate dielectric layer that at least partially covers an upper corner of the gate trench.

12. The semiconductor device of claim 10, wherein the gate trench extends longitudinally in the semiconductor layer structure and has a longitudinally-extending lower surface, opposed, longitudinally-extending opposed first and second side walls, and opposed first and second end walls, wherein the gate dielectric layer comprises a first portion that extends upwardly along the first end wall of the gate trench, and wherein the supplemental dielectric layer directly contacts the first portion of the gate dielectric layer.

13. The semiconductor device of claim 10, further comprising a gate bond pad and a gate bus, the gate finger being electrically connected to the gate bond pad through at least the gate bus, wherein the supplemental dielectric layer comprises a field oxide layer that extends underneath both the gate bond pad and the gate bus.

14. The semiconductor device of claim 10, wherein the supplemental dielectric layer comprises at least a portion of a second dielectric layer that directly contacts an upper surface of the semiconductor layer structure adjacent a sidewall of the gate trench, wherein a thickness of the second dielectric layer is at least twice a thickness of the gate dielectric layer.

15. The semiconductor device of claim 10, wherein the supplemental dielectric layer vertically overlaps the gate finger along substantially the entire length of the gate finger.

16. A semiconductor device, comprising:

a semiconductor layer structure having a gate trench therein;

a gate finger in the gate trench;

a gate bus;

a gate connector that electrically connects the gate finger to the gate bus;

a supplemental dielectric layer interposed in between an end portion of the gate finger and the gate connector;

an intermetal dielectric layer that vertically overlaps the supplemental dielectric layer; and a source contact, wherein the gate connector extends underneath the source contact, wherein the supplemental dielectric layer directly contacts a first portion of the gate finger and the intermetal dielectric layer directly contacts a second portion of the gate finger.

17. The semiconductor device of claim 16, wherein the gate connector directly contacts both the gate finger and the supplemental dielectric layer.

18. The semiconductor device of claim 17, further comprising a gate dielectric layer in the gate trench between the semiconductor layer structure and the gate finger.

19. The semiconductor device of claim 18, wherein the supplemental dielectric layer directly contacts a portion of the gate dielectric layer that at least partially covers an upper corner of the gate trench.

20. The semiconductor device of claim 18, wherein the supplemental dielectric layer comprises at least a portion of a second dielectric layer that directly contacts an upper surface of the semiconductor layer structure adjacent a sidewall of the gate trench, wherein a thickness of the second dielectric layer is at least four times a thickness of the gate dielectric layer.

21. The semiconductor device of claim 16, wherein the gate connector directly contacts the gate finger in between the supplemental dielectric layer and the intermetal dielectric layer.

* * * * *